United States Patent
Hu

(10) Patent No.: US 12,549,166 B2
(45) Date of Patent: Feb. 10, 2026

(54) SEGMENTED SELECTABLE SIGNAL CONDITIONING CIRCUIT AND MEASUREMENT DEVICE

(71) Applicant: EVE ENERGY CO., LTD., Huizhou (CN)

(72) Inventor: Jun Hu, Huizhou (CN)

(73) Assignee: EVE Energy Co., Ltd., GuangDong (CN)

( * ) Notice: Subject to any disclaimer, the term of this patent is extended or adjusted under 35 U.S.C. 154(b) by 247 days.

(21) Appl. No.: 18/127,004

(22) Filed: Mar. 28, 2023

(65) Prior Publication Data
US 2024/0128960 A1    Apr. 18, 2024

(30) Foreign Application Priority Data

Oct. 13, 2022 (CN) .......... 202211251346.X
Oct. 13, 2022 (CN) .......... 202222691926.2

(51) Int. Cl.
| | | |
|---|---|---|
| H03K 5/08 | (2006.01) | |
| H03F 3/45 | (2006.01) | |
| H03K 5/02 | (2006.01) | |

(52) U.S. Cl.
CPC ......... *H03K 5/084* (2013.01); *H03F 3/45475* (2013.01); *H03K 5/023* (2013.01)

(58) Field of Classification Search
None
See application file for complete search history.

(56) References Cited

U.S. PATENT DOCUMENTS

| | | | | |
|---|---|---|---|---|
| 4,166,245 A | * | 8/1979 | Roberts | G01R 13/40 324/96 |
| 5,557,207 A | * | 9/1996 | Duve | G01R 31/24 324/133 |
| 5,687,342 A | * | 11/1997 | Kass | G06F 12/0292 711/201 |
| 6,351,175 B1 | * | 2/2002 | Rapp | H03K 19/1732 327/415 |
| 7,459,903 B1 | * | 12/2008 | Tsai | G01R 19/16595 324/764.01 |
| 10,371,725 B1 | * | 8/2019 | Morgado | H02H 9/046 |
| 2024/0128961 A1 | * | 4/2024 | Hu | H03K 5/084 |

FOREIGN PATENT DOCUMENTS

JP        S5797454 A    6/1982

OTHER PUBLICATIONS

European Search Report, for Application No. EP23167229.6, issued date Sep. 8, 2023.

* cited by examiner

*Primary Examiner* — Thomas J. Hiltunen
(74) *Attorney, Agent, or Firm* — Sughrue Mion, PLLC

(57) ABSTRACT

A segment selectable signal conditioning circuit and a measurement device are provided. The circuit outputs respective voltage threshold signals through various voltage threshold sub-circuits. The voltage threshold signals are preset to have different threshold values. Each segment voltage conditioning sub-circuit conditions the input voltage signal according to the corresponding conduction signal to obtain a corresponding output voltage signal. The selection circuit receives the input voltage signal and each voltage threshold signal, and compares the voltage value of the input voltage signal to the threshold value of each voltage threshold signal respectively, and outputs the corresponding conduction signal based on the comparison result to achieve segment selectable voltage signal conditioning.

19 Claims, 4 Drawing Sheets

SEGMENTED SELECTABLE SIGNAL CONDITIONING CIRCUIT AND MEASUREMENT DEVICE

CROSS REFERENCE TO RELATED APPLICATIONS

The present application claims priority of Chinese Patent Application 202222691926.2, filed on Oct. 13, 2022, and priority of Chinese Patent Application 202211251346.X, filed on Oct. 13, 2022, in the China National Intellectual Property Administration, the entire contents of which are hereby incorporated by reference in their entireties.

TECHNICAL FIELD

The present disclosure relates to the field of signal conditioning, and in particular to a segmented selectable signal conditioning circuit and a measurement device.

BACKGROUND

A signal conditioning circuit is a circuit that converts an analogue signal into a digital signal that can be used for data acquisition, controlling processes, executing computations, displaying readouts, and so on. Sampling and conditioning a voltage signal is main components of the signal conditioning circuit.

While performing voltage sampling in practice, a range of an input voltage is significantly large. When the input voltage is relatively large, the input voltage may exceed a range of a sampling circuit. When the input voltage is small, sampling accuracy may be insufficient, or no data can be sampled. Usually, a same amplification multiple may be applied to amplify the input voltage. The sampling accuracy may be low and universality of sampling may be low. When a microcontroller is configured to control segmented sampling, the circuit may be complex and costly.

SUMMARY OF THE DISCLOSURE

Therefore, a segmented selectable signal conditioning circuit and a measurement device are provided to solve the problem in the voltage sampling and conditioning methods as mentioned in the above, such that an applicable sampling range of voltage sampling and conditioning may be increased, accuracy and universality of sampling may be improved, and scenarios that voltage sampling circuits can be applied may be increased.

According to a first aspect, a signal conditioning circuit is provided and includes: a segmented voltage threshold circuit, comprising X segmented voltage threshold sub-circuits, wherein the X segmented voltage threshold sub-circuits is configured to output X voltage threshold signals, and the X voltage threshold signals have different threshold values, and X is an integer greater than or equal to 1; a selection circuit, connected to the segmented voltage threshold circuit and configured to receive an input voltage signal and the X voltage threshold signals and output X+1 conduction signals, wherein each conduction signal of the X+1 conduction signals is output based on a comparison result between the input voltage signal and one of the X voltage threshold signals; and a segmented voltage conditioning circuit, connected to the selection circuit and comprising X+1 segmented voltage conditioning sub-circuits, wherein each of the X+1 segmented voltage conditioning sub-circuit is configured to condition the input voltage signal to output a corresponding output voltage signal based on a corresponding conduction signal of the X+1 conduction signals.

According to a second aspect, a signal measurement device is provided and includes: a signal conditioning circuit, comprising: a segmented voltage threshold circuit, comprising X segmented voltage threshold sub-circuits, wherein the X segmented voltage threshold sub-circuits is configured to output X voltage threshold signals, and the X voltage threshold signals have different threshold values, and X is an integer greater than or equal to 1; a selection circuit, connected to the segmented voltage threshold circuit and configured to receive an input voltage signal and the X voltage threshold signals and output X+1 conduction signals, wherein each conduction signal of the X+1 conduction signals is output based on a comparison result between the input voltage signal and one of the X voltage threshold signals; and a segmented voltage conditioning circuit, comprising X+1 segmented voltage conditioning sub-circuits, wherein each of the X+1 segmented voltage conditioning sub-circuit is configured to condition the input voltage signal to output a corresponding output voltage signal based on a corresponding conduction signal of the X+1 conduction signals.

According to a third aspect, a signal conditioning circuit is provided and includes: X segmented voltage threshold sub-circuits, configured to output X voltage threshold signals, and the X voltage threshold signals have different threshold values, and X is an integer greater than or equal to 1; a selection circuit, connected to the X segmented voltage threshold sub-circuits and configured to receive an input voltage signal and the X voltage threshold signals and output X+1 conduction signals, wherein each conduction signal of the X+1 conduction signals is output based on a comparison result between the input voltage signal and one of the X voltage threshold signals; and X+1 segmented voltage conditioning sub-circuits, wherein each of the X+1 segmented voltage conditioning sub-circuit is configured to condition the input voltage signal to output a corresponding output voltage signal based on a corresponding conduction signal of the X+1 conduction signals.

Figure 1:
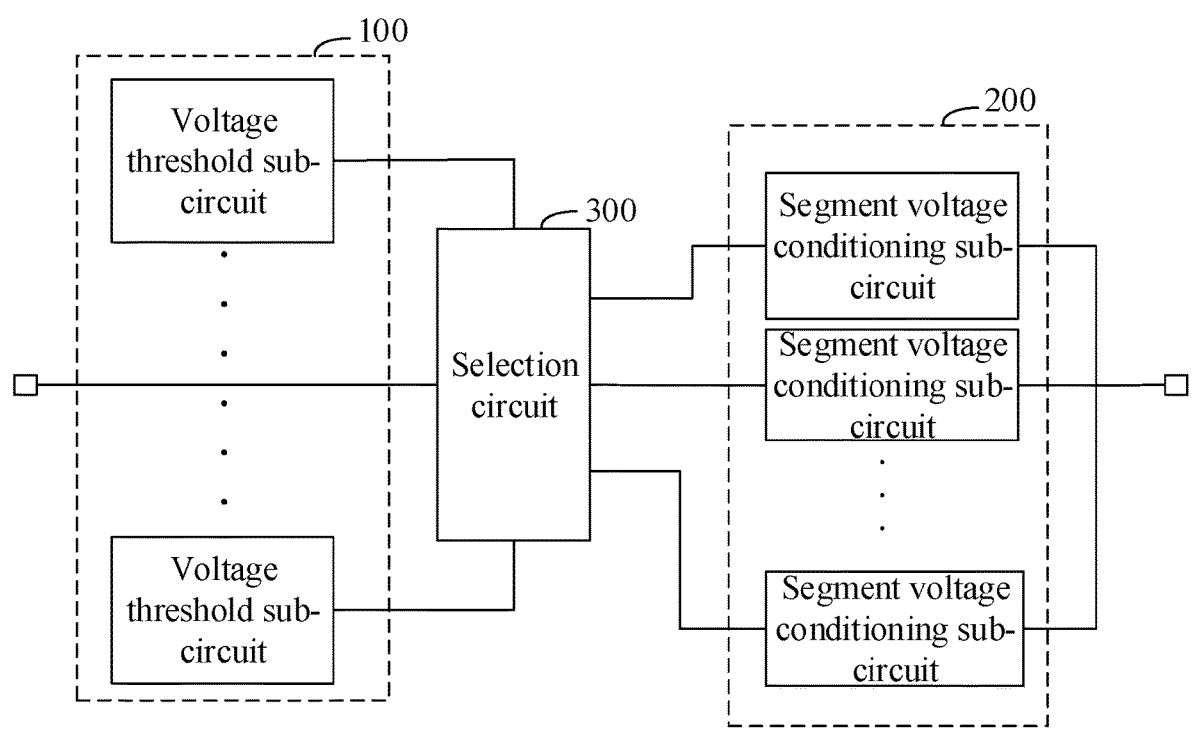
FIG. 1 is a first structural schematic view of a segmented selectable signal conditioning circuit according to an embodiment of the present disclosure.

REFERENCE NUMERALS IN THE DRAWINGS segmented voltage threshold circuit 100; first segmented voltage threshold sub-circuit 110; second segmented voltage threshold sub-circuit 120; segmented voltage conditioning circuit 200; first segmented voltage conditioning sub-circuit 210; first proportional operational amplifier sub-circuit 212; first voltage following sub-circuit 214; second segmented voltage conditioning sub-circuit 220; second proportional operational amplifier sub-circuit 222; first differential amplifier sub-circuit 224; first continuously-output conditioning circuit 226; second voltage following sub-circuit 228; third segmented voltage conditioning sub-circuit 230; third proportional operational amplifier sub-circuit 232; second differential amplifier sub-circuit 234; second continuously-output conditioning circuit 236; third voltage following sub-circuit 238; selection circuit 300; first comparator B1; second comparator B2; third comparator B3; fourth comparator B4; first switching tube Q1; second switching tube Q2; third switching tube Q3; fourth switching tube Q4; fifth switching tube Q5; first resistor R1; second resistor R2; third resistor R3; fourth resistor R4; fifth resistor R5; sixth resistor R6; seventh resistor R7; eighth resistor R8; ninth resistor R9; tenth resistor R10; eleventh resistor R11; twelfth resistor R12; thirteenth resistor R13; fourteenth resistor R14; fifteenth resistor R15; sixteenth resistor R16; seventeenth resistor R17; eighteenth resistor R18; nineteenth resistor R19; twentieth resistor R20; twenty-first resistor R21; twenty-second resistor R22.

DETAILED DESCRIPTION

In order to enable any ordinary skilled person in the art to understand the present disclosure better, technical solutions in the embodiments of the present disclosure will be described clearly and completely below by referring to the accompanying drawings in the embodiments of the present disclosure. Apparently, the described embodiments are only a part of but not all of the embodiments of the present disclosure. All other embodiments obtained by any ordinary skilled person in the art based on the embodiments of the present disclosure without creative work shall fall within the scope of the present disclosure.

To noted that the terms "first", "second", and so on, in the specification, claims, and the accompanying drawings of the present disclosure are used to distinguish similar objects and shall not be interpreted as describing a particular order or sequence. It shall be understood that the data described by the terms are interchangeable, where appropriate, for the purposes of the embodiments of the present disclosure. Furthermore, the terms "include", "have", and any variation thereof, are used to cover non-exclusive inclusion. For example, a process, a method, a system, a product or an apparatus including a series of operations or units need not be limited to those operations or units that are clearly listed, but may include those that are not explicitly listed or inherently included in the process, the method, the system, the product or the apparatus.

In addition, the term "plurality" shall have the meaning of two and more than two.

According to the present disclosure, a signal conditioning circuit is provided and includes: a segmented voltage threshold circuit, a selection circuit, and a segmented voltage conditioning circuit. The segmented voltage threshold circuit includes X segmented voltage threshold sub-circuits. The X segmented voltage threshold sub-circuits is configured to output X voltage threshold signals, and the X voltage threshold signals have different threshold values, and X is an integer greater than or equal to 1. The selection circuit is connected to the segmented voltage threshold circuit and configured to receive an input voltage signal and the X voltage threshold signals and output X+1 conduction signals. Each conduction signal of the X+1 conduction signals is output based on a comparison result between the input voltage signal and one of the X voltage threshold signals. The segmented voltage conditioning circuit is connected to the selection circuit and includes X+1 segmented voltage conditioning sub-circuits. Each of the X+1 segmented voltage conditioning sub-circuit is configured to condition the input voltage signal to output a corresponding output voltage signal based on a corresponding conduction signal of the X+1 conduction signals.

In some embodiments, X is equal to 2. The X segmented voltage threshold sub-circuits include a first segmented voltage threshold sub-circuit and a second segmented voltage threshold sub-circuit, the X voltage threshold signals include a first voltage threshold signal and a second voltage threshold signal, and a threshold value of the first voltage threshold signal is less than a threshold value of the second voltage threshold signal. The first segmented voltage threshold sub-circuit is configured to output the first voltage threshold signal, the second segmented voltage threshold sub-circuit is configured to output the second voltage threshold signal. The X+1 conduction signals include a first conduction signal, a second conduction signal, and a third conduction signal. The first conduction signal is output in response to a voltage value of the input voltage signal being less than the threshold value of the first voltage threshold signal, the second conduction signal is output in response to a voltage value of the input voltage signal being greater than the threshold value of the first voltage threshold signal and less than the threshold value of the second voltage threshold signal, and the third conduction signal is output in response to a voltage value of the input voltage signal being greater than the threshold value of the second voltage threshold signal. The X+1 segmented voltage conditioning sub-circuits include a first segmented voltage conditioning sub-circuit, a second segmented voltage conditioning sub-circuit, and a third segmented voltage conditioning sub-circuit. The first segmented voltage conditioning sub-circuit is configured to condition the input voltage signal to output a first output voltage signal based on the first conduction signal, the second segmented voltage conditioning sub-circuit is configured to condition the input voltage signal to output a second output voltage signal based on the second conduction signal, and the third segmented voltage conditioning sub-circuit is configured to condition the input voltage signal to output a third output voltage signal based on the third conduction signal.

In some embodiments, the first segmented voltage conditioning sub-circuit includes a third switching tube and a first proportional operational amplifier sub-circuit. A gate of the third switching tube is connected to the selection circuit, a source of the third switching tube is connected to an input terminal of the first proportional operational amplifier sub-circuit, and an output terminal of the first proportional operational amplifier sub-circuit is configured to output a first proportional amplified voltage signal. The second segmented voltage conditioning sub-circuit includes a fourth switching tube and a second proportional operational amplifier sub-circuit. A gate of the fourth switching tube is connected to the selection circuit, a source of the fourth switching tube is connected to an input terminal of the second proportional operational amplifier sub-circuit, and an output terminal of the second proportional operational amplifier sub-circuit is configured to output a second proportional amplified voltage signal. The third segmented voltage conditioning sub-circuit includes a fifth switching tube and a third proportional operational amplifier sub-circuit. A gate of the fifth switching tube is connected to the selection circuit, a source of the fifth switching tube is connected to a input terminal of the third proportional operational amplifier sub-circuit, and an output terminal of the third proportional operational amplifier sub-circuit is configured to output a third proportional amplified voltage signal.

In some embodiments, the second segmented voltage conditioning sub-circuit further includes a first differential amplifier sub-circuit and a first continuously-output conditioning circuit. A first input terminal of the first differential amplifier sub-circuit is connected to the output terminal of the second proportional operational amplifier sub-circuit, a second input terminal of the first differential amplifier sub-circuit is connected to the first continuously-output conditioning circuit, and an output terminal of the first differential amplifier sub-circuit is configured to output a conditioned second proportional amplification voltage signal which is obtained as the second proportional amplification voltage signal is conditioned. The third segmented voltage conditioning sub-circuit further includes a second differential amplifier sub-circuit and a second continuously-output conditioning circuit. A first input terminal of the second differential amplifier sub-circuit is connected to the output terminal of the third proportional operational amplifier sub-circuit, a third input terminal of the second differential amplifier sub-circuit is connected to the second continuously-output conditioning circuit, and an output terminal of the second differential amplifier sub-circuit is configured to output a conditioned third proportional amplification voltage signal which is obtained as the third proportional amplification voltage signal is conditioned.

In some embodiments, the first proportional operational amplifier sub-circuit includes a first proportional operational amplifier, a ninth resistor, and a tenth resistor. A positive input terminal of the first proportional operational amplifier is used as the input terminal of the first proportional operational amplifier sub-circuit, a negative input terminal of the first proportional operational amplifier is connected to one terminal of the ninth resistor and one terminal of the tenth resistor, another terminal of the ninth resistor is grounded, and another terminal of the tenth resistor is connected to an output terminal of the first proportional operational amplifier. The second proportional operational amplifier sub-circuit includes a second proportional operational amplifier, an eleventh resistor, and a twelfth resistor. A positive input terminal of the second proportional operational amplifier is used as the input terminal of the second proportional operational amplifier sub-circuit, a negative input terminal of the second proportional operational amplifier is connected to one terminal of the eleventh resistor and one terminal of the twelfth resistor, another terminal of the eleventh resistor is grounded, and another terminal of the twelfth resistor is connected to an output terminal of the second proportional operational amplifier. The third proportional operational amplifier sub-circuit includes a third proportional operational amplifier, a thirteenth resistor, and a fourteenth resistor. A positive input terminal of the third proportional operational amplifier is used as the input terminal of the third proportional operational amplifier sub-circuit, a negative input terminal of the third proportional operational amplifier is connected to one terminal of the thirteenth resistor and one terminal of the fourteenth resistor, another terminal of the thirteenth resistor is grounded, and another terminal of the fourteenth resistor is connected to an output terminal of the third proportional operational amplifier.

In some embodiments, the first continuously-output conditioning circuit includes a fifth resistor and a sixth resistor which are series-connected, one end of the series-connected fifth resistor and the sixth resistor is connected to a DC power supply and another end of the series-connected fifth resistor and the sixth resistor is grounded. The first differential amplifier sub-circuit includes a first differential amplifier, a fifteenth resistor, a sixteenth resistor, an seventeenth resistor, and an eighteenth resistor. A positive input terminal of the first differential amplifier is connected to one terminal of the fifteenth resistor and one terminal of the sixteenth resistor, another terminal of the fifteenth resistor is connected to the output terminal of the second proportional operational amplifier sub-circuit, another terminal of the sixteenth resistor is grounded, a negative input terminal of the first differential amplifier is connected to one terminal of the seventeenth resistor and one terminal of the eighteenth resistor, another terminal of the seventeenth resistor is connected between the third resistor and the fourth resistor, and another terminal of the eighteenth resistor is connected to an output terminal of the first differential amplifier. The second continuously-output conditioning circuit includes a seventh resistor and an eighth resistor which are series-connected, one end of the series-connected seventh resistor and the eighth resistor is connected to a DC power supply and another end of the series-connected seventh resistor and the eighth resistor is grounded. The second differential amplifier sub-circuit includes a second differential amplifier, a nineteenth resistor, a twentieth resistor, a twenty-first resistor, and a twenty-second resistor. A positive input terminal of the second differential amplifier is connected to one terminal of the nineteenth resistor and one terminal of the twentieth resistor, another terminal of the nineteenth resistor is connected to the output terminal of the second proportional operational amplifier sub-circuit, another terminal of the twentieth resistor is grounded, a negative input terminal of the second differential amplifier is connected to one terminal of the twenty-first resistor and one terminal of the twenty-second resistor, another terminal of the twenty-first resistor is connected between the third resistor and the fourth resistor, and another terminal of the twenty-second resistor is connected to an output terminal of the second differential amplifier.

In some embodiments, the fifteenth resistor, the sixteenth resistor, the seventeenth resistor, and the eighteenth resistor have the same resistor value. The nineteenth resistor, the twentieth resistor, the twenty-first resistor, and the twenty-second resistor have the same resistor value.

In some embodiments, the first segmented voltage threshold sub-circuit includes a first resistor and a second resistor which are series-connected. One end of the series-connected first resistor and the second resistor is connected to a DC power supply and another end of the series-connected first resistor and the second resistor is grounded. The second segmented voltage threshold sub-circuit includes a third resistor and a fourth resistor which are series-connected. One end of the series-connected third resistor and the fourth resistor is connected to the DC power supply through the selection circuit and another end of the series-connected third resistor and the fourth resistor is grounded.

In some embodiments, the selection circuit includes a first comparator, a second comparator, a third comparator, a fourth comparator, a first switching tube, and a second switching tube. A first input terminal of the first comparator is used to receive the input voltage signal, a second input terminal of the first comparator is connected to the first segmented voltage threshold sub-circuit, an output terminal of the first comparator is connected to the first segmented voltage conditioning sub-circuit. A first input terminal of the second comparator is connected to the first segmented voltage threshold sub-circuit, a second input terminal of the second comparator is used to receive the input voltage signal, and an output terminal of the second comparator is connected to a gate of the first switching tube and a gate of the second switching tube. A first input terminal of the third comparator is connected to the second segmented voltage threshold sub-circuit, a second input terminal of the second comparator is connected to a source of the first switching tube, and an output terminal of the third comparator is connected to the third segmented voltage conditioning sub-circuit. A first input terminal of the fourth comparator is connected to a source of the first switching tube, a second input terminal of the fourth comparator is connected to the second segmented voltage threshold sub-circuit, an output terminal of the fourth comparator is connected to the second segmented voltage conditioning sub-circuit. The source of the first switching tube is further grounded, a drain of the first switching tube is used to receive the input voltage signal. A source of the second switching tube is grounded and connected to the one end of the series-connected third resistor and the fourth resistor, a drain of the second switching tube is connected to the DC power supply.

In some embodiments, the first segmented voltage conditioning sub-circuit further includes a first voltage following sub-circuit. A positive input terminal of the first voltage following sub-circuit is connected to the output terminal of the first proportional operational amplifier sub-circuit, and a negative input terminal of the first voltage following sub-circuit is connected to the output terminal of the first voltage following sub-circuit. The second segmented voltage conditioning sub-circuit further includes a second voltage following sub-circuit. A positive input terminal of the second voltage following sub-circuit is connected to the output terminal of the second proportional operational amplifier sub-circuit, and a negative input terminal of the second voltage following sub-circuit is connected to the output terminal of the second voltage following sub-circuit. The third segmented voltage conditioning sub-circuit further includes a third voltage following sub-circuit. A positive input terminal of the third voltage following sub-circuit is connected to the output terminal of the third proportional operational amplifier sub-circuit, and a negative input terminal of the third voltage following sub-circuit is connected to the output terminal of the third voltage following sub-circuit.

According to the present disclosure, a signal measurement device is provided and includes: a signal conditioning circuit. The signal conditioning circuit includes a segmented voltage threshold circuit, a selection circuit, and a segmented voltage conditioning circuit. The segmented voltage threshold circuit includes X segmented voltage threshold sub-circuits. The X segmented voltage threshold sub-circuits is configured to output X voltage threshold signals, and the X voltage threshold signals have different threshold values, and X is an integer greater than or equal to 1. The selection circuit is connected to the segmented voltage threshold circuit and configured to receive an input voltage signal and the X voltage threshold signals and output X+1 conduction signals. Each conduction signal of the X+1 conduction signals is output based on a comparison result between the input voltage signal and one of the X voltage threshold signals. The segmented voltage conditioning circuit includes X+1 segmented voltage conditioning sub-circuits. Each of the X+1 segmented voltage conditioning sub-circuit is configured to condition the input voltage signal to output a corresponding output voltage signal based on a corresponding conduction signal of the X+1 conduction signals.

In some embodiments, X is equal to 2. The X segmented voltage threshold sub-circuits include a first segmented voltage threshold sub-circuit and a second segmented voltage threshold sub-circuit, the X voltage threshold signals include a first voltage threshold signal and a second voltage threshold signal, and a threshold value of the first voltage threshold signal is less than a threshold value of the second voltage threshold signal. The first segmented voltage threshold sub-circuit is configured to output the first voltage threshold signal, the second segmented voltage threshold sub-circuit is configured to output the second voltage threshold signal. The X+1 conduction signals comprise a first conduction signal, a second conduction signal, and a third conduction signal. The first conduction signal is output in response to a voltage value of the input voltage signal being less than the threshold value of the first voltage threshold signal, the second conduction signal is output in response to a voltage value of the input voltage signal being greater than the threshold value of the first voltage threshold signal and less than the threshold value of the second voltage threshold signal, and the third conduction signal is output in response to a voltage value of the input voltage signal being greater than the threshold value of the second voltage threshold signal. The X+1 segmented voltage conditioning sub-circuits include a first segmented voltage conditioning sub-circuit, a second segmented voltage conditioning sub-circuit, and a third segmented voltage conditioning sub-circuit. The first segmented voltage conditioning sub-circuit is configured to condition the input voltage signal to output a first output voltage signal based on the first conduction signal, the second segmented voltage conditioning sub-circuit is configured to condition the input voltage signal to output a second output voltage signal based on the second conduction signal, and the third segmented voltage conditioning sub-circuit is configured to condition the input voltage signal to output a third output voltage signal based on the third conduction signal.

In some embodiments, the first segmented voltage conditioning sub-circuit includes a third switching tube and a first proportional operational amplifier sub-circuit. A gate of the third switching tube is connected to the selection circuit, a source of the third switching tube is connected to an input terminal of the first proportional operational amplifier sub-circuit, and an output terminal of the first proportional operational amplifier sub-circuit is configured to output a first proportional amplified voltage signal. The second segmented voltage conditioning sub-circuit includes a fourth switching tube and a second proportional operational amplifier sub-circuit. A gate of the fourth switching tube is connected to the selection circuit, a source of the fourth switching tube is connected to an input terminal of the second proportional operational amplifier sub-circuit, and an output terminal of the second proportional operational amplifier sub-circuit is configured to output a second proportional amplified voltage signal. The third segmented voltage conditioning sub-circuit includes a fifth switching tube and a third proportional operational amplifier sub-circuit. A gate of the fifth switching tube is connected to the selection circuit, a source of the fifth switching tube is connected to an input terminal of the third proportional operational amplifier sub-circuit, and an output terminal of the third proportional operational amplifier sub-circuit is configured to output a third proportional amplified voltage signal.

In some embodiments, the second segmented voltage conditioning sub-circuit further includes a first differential amplifier sub-circuit and a first continuously-output conditioning circuit. A first input terminal of the first differential amplifier sub-circuit is connected to the output terminal of the second proportional operational amplifier sub-circuit, a second input terminal of the first differential amplifier sub-circuit is connected to the first continuously-output conditioning circuit, and an output terminal of the first differential amplifier sub-circuit is configured to output a conditioned second proportional amplification voltage signal which is obtained as the second proportional amplification voltage signal is conditioned. The third segmented voltage conditioning sub-circuit further includes a second differential amplifier sub-circuit and a second continuously-output conditioning circuit. A first input terminal of the second differential amplifier sub-circuit is connected to the output terminal of the third proportional operational amplifier sub-circuit, a third input terminal of the second differential amplifier sub-circuit is connected to the second continuously-output conditioning circuit, and an output terminal of the second differential amplifier sub-circuit is configured to output a conditioned third proportional amplification voltage signal which is obtained as the third proportional amplification voltage signal is conditioned.

In some embodiments, the first proportional operational amplifier sub-circuit includes a first proportional operational amplifier, a ninth resistor, and a tenth resistor. A positive input terminal of the first proportional operational amplifier is used as the input terminal of the first proportional operational amplifier sub-circuit, a negative input terminal of the first proportional operational amplifier is connected to one terminal of the ninth resistor and one terminal of the tenth resistor, another terminal of the ninth resistor is grounded, and another terminal of the tenth resistor is connected to an output terminal of the first proportional operational amplifier. The second proportional operational amplifier sub-circuit includes a second proportional operational amplifier, an eleventh resistor, and a twelfth resistor. A positive input terminal of the second proportional operational amplifier is used as the input terminal of the second proportional operational amplifier sub-circuit, a negative input terminal of the second proportional operational amplifier is connected to one terminal of the eleventh resistor and one terminal of the twelfth resistor, another terminal of the eleventh resistor is grounded, and another terminal of the twelfth resistor is connected to an output terminal of the second proportional operational amplifier. The third proportional operational amplifier sub-circuit includes a third proportional operational amplifier, a thirteenth resistor, and a fourteenth resistor. A positive input terminal of the third proportional operational amplifier is used as the input terminal of the third proportional operational amplifier sub-circuit, a negative input terminal of the third proportional operational amplifier is connected to one terminal of the thirteenth resistor and one terminal of the fourteenth resistor, another terminal of the thirteenth resistor is grounded, and another terminal of the fourteenth resistor is connected to an output terminal of the third proportional operational amplifier.

In some embodiments, the first continuously-output conditioning circuit includes a fifth resistor and a sixth resistor which are series-connected, one end of the series-connected fifth resistor and the sixth resistor is connected to a DC power supply and another end of the series-connected fifth resistor and the sixth resistor is grounded. The first differential amplifier sub-circuit includes a first differential amplifier, a fifteenth resistor, a sixteenth resistor, a seventeenth resistor, and an eighteenth resistor. A positive input terminal of the first differential amplifier is connected to one terminal of the fifteenth resistor and one terminal of the sixteenth resistor, another terminal of the fifteenth resistor is connected to the output terminal of the second proportional operational amplifier sub-circuit, another terminal of the sixteenth resistor is grounded, a negative input terminal of the first differential amplifier is connected to one terminal of the seventeenth resistor and one terminal of the eighteenth resistor, another terminal of the seventeenth resistor is connected between the third resistor and the fourth resistor, and another terminal of the eighteenth resistor is connected to an output terminal of the first differential amplifier. The second continuously-output conditioning circuit includes a seventh resistor and an eighth resistor which are series-connected, one end of the series-connected seventh resistor and the eighth resistor is connected to a DC power supply and another end of the series-connected seventh resistor and the eighth resistor is grounded. The second differential amplifier sub-circuit includes a second differential amplifier, a nineteenth resistor, a twentieth resistor, a twenty-first resistor, and a twenty-second resistor. A positive input terminal of the second differential amplifier is connected to one terminal of the nineteenth resistor and one terminal of the twentieth resistor, another terminal of the nineteenth resistor is connected to the output terminal of the second proportional operational amplifier sub-circuit, another terminal of the twentieth resistor is grounded, a negative input terminal of the second differential amplifier is connected to one terminal of the twenty-first resistor and one terminal of the twenty-second resistor, another terminal of the twenty-first resistor is connected between the third resistor and the fourth resistor, and another terminal of the twenty-second resistor is connected to an output terminal of the second differential amplifier.

In some embodiments, the first segmented voltage threshold sub-circuit includes a first resistor and a second resistor which are series-connected. One end of the series-connected first resistor and the second resistor is connected to a DC power supply and another end of the series-connected first resistor and the second resistor is grounded. The second segmented voltage threshold sub-circuit includes a third resistor and a fourth resistor which are series-connected. One end of the series-connected third resistor and the fourth resistor is connected to the DC power supply through the selection circuit and another end of the series-connected third resistor and the fourth resistor is grounded.

In some embodiments, the selection circuit includes a first comparator, a second comparator, a third comparator, a fourth comparator, a first switching tube, and a second switching tube. A first input terminal of the first comparator is used to receive the input voltage signal, a second input terminal of the first comparator is connected to the first segmented voltage threshold sub-circuit, an output terminal of the first comparator is connected to the first segmented voltage conditioning sub-circuit. A first input terminal of the second comparator is connected to the first segmented voltage threshold sub-circuit, a second input terminal of the second comparator is used to receive the input voltage signal, and an output terminal of the second comparator is connected to a gate of the first switching tube and a gate of the second switching tube. A first input terminal of the third comparator is connected to the second segmented voltage threshold sub-circuit, a second input terminal of the second comparator is connected to a source of the first switching tube, and an output terminal of the third comparator is connected to the third segmented voltage conditioning subcircuit. A first input terminal of the fourth comparator is connected to a source of the first switching tube, a second input terminal of the fourth comparator is connected to the second segmented voltage threshold sub-circuit, an output terminal of the fourth comparator is connected to the second segmented voltage conditioning sub-circuit. The source of the first switching tube is further grounded, a drain of the first switching tube is used to receive the input voltage signal. A source of the second switching tube is grounded and connected to the one end of the series-connected third resistor and the fourth resistor, a drain of the second switching tube is connected to the DC power supply.

In some embodiments, the first segmented voltage conditioning sub-circuit further includes a first voltage following sub-circuit. A positive input terminal of the first voltage following sub-circuit is connected to the output terminal of the first proportional operational amplifier sub-circuit, and a negative input terminal of the first voltage following sub-circuit is connected to the output terminal of the first voltage following sub-circuit. The second segmented voltage conditioning sub-circuit further includes a second voltage following sub-circuit. A positive input terminal of the second voltage following sub-circuit is connected to the output terminal of the second proportional operational amplifier sub-circuit, and a negative input terminal of the second voltage following sub-circuit is connected to the output terminal of the second voltage following sub-circuit. The third segmented voltage conditioning sub-circuit further includes a third voltage following sub-circuit. A positive input terminal of the third voltage following sub-circuit is connected to the output terminal of the third proportional operational amplifier sub-circuit, and a negative input terminal of the third voltage following sub-circuit is connected to the output terminal of the third voltage following sub-circuit.

According to the present disclosure, a signal conditioning circuit is provided and includes: X segmented voltage threshold sub-circuits, a selection circuit, and X+1 segmented voltage conditioning sub-circuits. The X segmented voltage threshold sub-circuits is configured to output X voltage threshold signals, and the X voltage threshold signals have different threshold values, and X is an integer greater than or equal to 1. The selection circuit is connected to the X segmented voltage threshold sub-circuits and configured to receive an input voltage signal and the X voltage threshold signals and output X+1 conduction signals. Each conduction signal of the X+1 conduction signals is output based on a comparison result between the input voltage signal and one of the X voltage threshold signals. Each of the X+1 segmented voltage conditioning sub-circuit is configured to condition the input voltage signal to output a corresponding output voltage signal based on a corresponding conduction signal of the X+1 conduction signals.

In the following, the present disclosure will be described by taking X=2 as examples.

In order to solve problem of the voltage sampling and condition method in the art as mentioned in the above, in an embodiment, as shown in FIG. 1, a segmented selectable signal conditioning circuit is provided and includes a segmented voltage threshold circuit 100, a segmented voltage conditioning circuit 200, and a selection circuit 300.

The segmented voltage threshold circuit 100 includes at least two voltage threshold sub-circuits. Each voltage threshold sub-circuit is configured to output a corresponding voltage threshold signal. Voltage threshold signals of the at least two voltage threshold sub-circuits preset different threshold values. The segmented voltage conditioning circuit 200 includes a plurality of segmented voltage conditioning sub-circuits. Each segmented voltage conditioning sub-circuit is configured to condition an input voltage signal based on a corresponding conduction signal to obtain an output voltage signal. The selection circuit 300 is connected to the segmented voltage threshold circuit 100 and the segmented voltage conditioning circuit 200. The selection circuit 300 is configured to: receive the input voltage signal and each voltage threshold signal; compare a value of the input voltage signal to the threshold value of each voltage threshold signal; and output the corresponding conduction signal based on a comparison result.

The segmented voltage threshold circuit 100 may include at least two corresponding voltage threshold sub-circuits. Each voltage threshold sub-circuit is connected to the selection circuit. A corresponding resistance value may be set for each voltage threshold sub-circuit, such that each voltage threshold sub-circuit outputs the voltage threshold signal having the corresponding threshold value to the selection circuit. The voltage threshold signals output by the voltage threshold sub-circuits are preset to have different threshold values. The threshold value of the voltage threshold signal refers to the corresponding voltage threshold value.

The segmented voltage conditioning circuit 200 may include at least three corresponding segmented voltage conditioning sub-circuits. Each segmented voltage conditioning sub-circuit is connected to the selection circuit. The segmented voltage conditioning sub-circuit may receive the conduction signal transmitted from the selection circuit, such that the segmented voltage conditioning sub-circuit may condition the input voltage signal based on the corresponding conduction signal to obtain an output voltage signal.

The selection circuit 300 may be configured with an input interface. The input interface is configured to receive the input voltage signal. Since the selection circuit 300 is connected to each voltage threshold sub-circuit, the selection circuit 300 may receive the input voltage signal and each voltage threshold signal; compare the input voltage signal with each voltage threshold signal respectively; and output corresponding conduction signals based on the comparison result. In this way, the voltage signal may be conditioned in a multi-segmented and selectable manner based on a signal conditioning channel having set segmented voltage ranges.

In the above embodiments, the segmented voltage threshold circuit 100, the segmented voltage conditioning circuit 200, and selection circuit 300 are arranged. Voltage signal conditioning is optimized. The voltage is automatically segmented and conditioned. Therefore, the circuit may be flexibly adapted for multi-segment voltage conditioning. The applicable sampling range of voltage sampling conditioning may be increased, and sampling accuracy and universality may be improved. In this way, scenarios that the voltage sampling conditioning can be applied may be increased, and universality of the circuit and accuracy of sampling conditioning may be improved.

Figure 2:
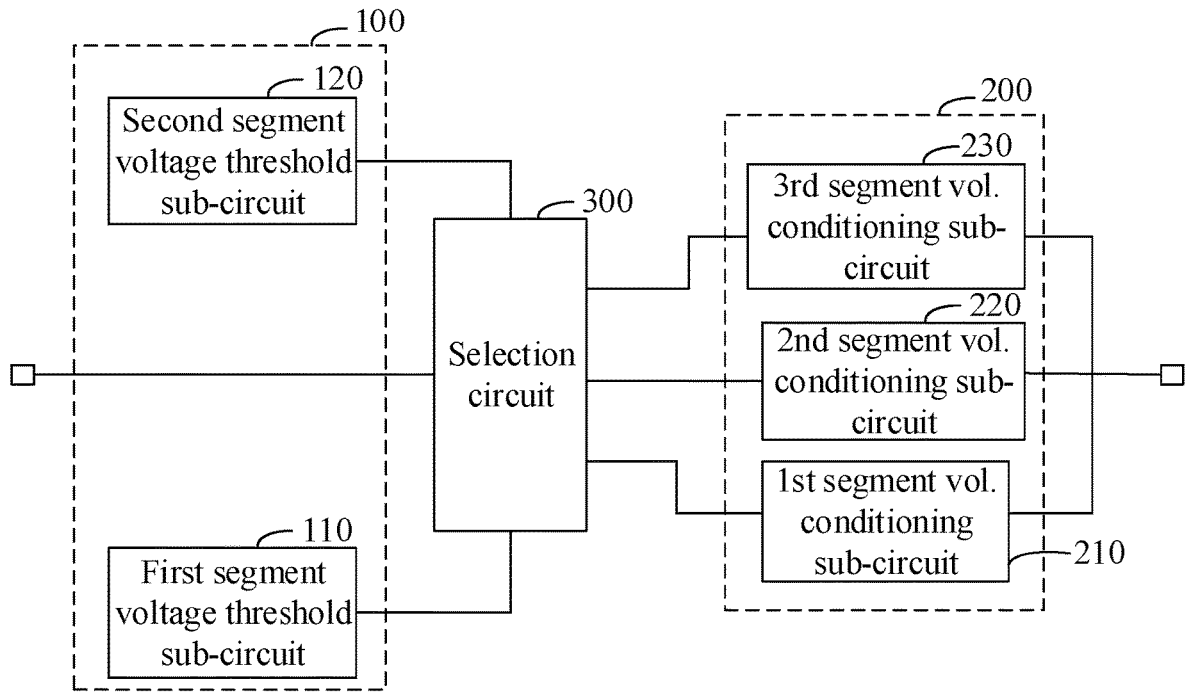
FIG. 2 is a second structural schematic view of a segmented selectable signal conditioning circuit according to an embodiment of the present disclosure.

In an embodiment, as shown in FIG. 2, a segmented selectable signal conditioning circuit is provided. The segmented selectable signal conditioning circuit includes a segmented voltage threshold circuit 100, a segmented voltage conditioning circuit 200, and a selection circuit 300. The segmented voltage threshold circuit 100 includes at least a first segmented voltage threshold sub-circuit 110 and a second segmented voltage threshold sub-circuit 120. The segmented voltage conditioning circuit 200 includes at least a first segmented voltage conditioning sub-circuit 210, a second segmented voltage conditioning sub-circuit 220, and a third segmented voltage conditioning sub-circuit 230.

The first segmented voltage threshold sub-circuit 110 is configured to output a first voltage threshold signal. The second segmented voltage threshold sub-circuit 120 is configured to output a second voltage threshold signal. A threshold value of the first voltage threshold signal is less than a threshold value of the second voltage threshold signal. The first segmented voltage conditioning sub-circuit 210 is configured to condition the input voltage signal, based on a received first conduction signal, to output a first output voltage signal. The second segmented voltage conditioning sub-circuit 220 is configured to condition the input voltage signal, based on a received second conduction signal, to output a second output voltage signal. The third segmented voltage conditioning sub-circuit 230 is configured to condition the input voltage signal, based on a received third conduction signal, to output a third output voltage signal. The selection circuit 300 is configured to receive the input voltage signal, the first voltage threshold signal, and the second voltage threshold signal. The selection circuit 300 is further configured to: output the first conduction signal in response to the voltage value of the input voltage signal being less than the threshold value of the first voltage threshold signal; output the second conduction signal in response to the voltage value of the input voltage signal being greater than the threshold value of the first voltage threshold signal and less than the threshold value of the second voltage threshold signal; and output the third conduction signal in response to the voltage value of the input voltage signal being greater than the threshold value of the second voltage threshold signal.

The segmented voltage threshold circuit 100 may include at least 2 corresponding sub-circuits. For example, the segmented voltage threshold circuit 100 may include the first segmented voltage threshold sub-circuit 110 and an N-th segmented voltage threshold sub-circuit. The N is a positive integer greater than or equal to 2. Exemplarily, in the present embodiment, voltage signal conditioning will be illustrated by diving the voltage signal into three voltage ranges, and that is, the segmented voltage threshold circuit 100 includes the first segmented voltage threshold sub-circuit 110 and the second segmented voltage threshold sub-circuit 120. When four voltage ranges are applied, the segmented voltage threshold circuit 100 includes three corresponding sub-circuits; when five voltage ranges are applied, the segmented voltage threshold circuit 100 includes four corresponding sub-circuits; and so on. Voltage signal conditioning processes for the four voltage ranges or the five voltage ranges may b e referred to the processes for the three voltage ranges, and will not be repeated here.

The first segment voltage threshold sub-circuit 110 is connected to the selection circuit 300. A resistance value may be set for the first segment voltage threshold sub-circuit 110, such that the first segment voltage threshold sub-circuit 110 may output the first voltage threshold signal to the selection circuit 300. The second segmented voltage threshold sub-circuit 120 is connected to the selection circuit 300. A resistance value may be set for the second segmented voltage threshold sub-circuit 120, such that the second segmented voltage threshold sub-circuit 120 may output the second voltage threshold signal to the selection circuit 300. The threshold value of the first voltage threshold signal is less than the threshold value of the second voltage threshold signal. The threshold value of the first voltage threshold signal and the threshold value of the second voltage threshold signal refer to corresponding voltage threshold values.

The segmented voltage conditioning circuit 200 may include at least 3 corresponding sub-circuits. For example, the segmented voltage conditioning circuit 200 may include the first segmented voltage conditioning sub-circuit 210, the second segmented voltage conditioning sub-circuit 220, and an M-th segmented voltage conditioning sub-circuit. The M is a positive integer greater than or equal to 3. Exemplarily, in the present embodiment, voltage signal conditioning will be illustrated by diving the voltage signal into three voltage ranges, and that is, the segmented voltage conditioning circuit 200 includes the first segmented voltage conditioning sub-circuit 210, the second segmented voltage conditioning sub-circuit 220, and the third segmented voltage conditioning sub-circuit 230. When four voltage ranges are applied, the segmented voltage conditioning circuit 200 includes four corresponding sub-circuits; when five voltage ranges are applied, the segmented voltage conditioning circuit 200 includes five corresponding sub-circuits; and so on. Voltage signal conditioning processes for the four voltage ranges or the five voltage ranges may be referred to the processes for the three voltage ranges, and will not be repeated here.

The selection circuit 300 may be configured with an input interface, and the input interface may be configured to receive the input voltage signal. Since the selection circuit 300 is connected to the first segmented voltage threshold sub-circuit 110 and the second segmented voltage threshold sub-circuit 120, the selection circuit 300 may receive the input voltage signal, the first voltage threshold signal, and the second voltage threshold signal and compare the input voltage signal with the first voltage threshold signal and the second voltage threshold signal respectively for processing. Further, the selection circuit 300 may output, based on the comparison result, the first conduction signal to the first segmented voltage conditioning sub-circuit 210 in response to the value of the input voltage signal being less than the threshold value of the first voltage threshold signal, such that the first segmented voltage conditioning sub-circuit 210 may condition, based on the received first conduction signal, the input voltage signal and output the first output voltage signal. The selection circuit 300 may output the second conduction signal in response to the value of the input voltage signal being greater than the threshold value of the first voltage threshold signal and less than the threshold value of the second voltage threshold signal, such that the second segment voltage conditioning sub-circuit 220 may condition the input voltage signal, based on the received second conduction signal, and output the second output voltage signal. The selection circuit 300 may output a third conduction signal in response to the value of the input voltage signal being greater than the threshold value of the second voltage threshold signal, such that the third segmented voltage conditioning sub-circuit 230 may condition the input voltage signal, based on the received third conduction signal, and output a third output voltage signal. In this way, the voltage signal may be conditioned in a multi-segmented and selectable manner based on the signal conditioning channel having set segmented voltage ranges.

In the above embodiment, the segmented voltage threshold circuit 100, the segmented voltage conditioning circuit 200, and the selection circuit 300 are arranged. Voltage signal conditioning is optimized. The voltage may be automatically segmented and conditioned. The circuit may be flexibly adapted for multi-segment voltage conditioning. The applicable sampling range of voltage sampling conditioning may be increased, and sampling accuracy and universality may be improved. Scenarios that voltage sampling conditioning can be applied may be increased. Universality of the circuit and the accuracy of sampling conditioning may be improved.

Figure 3:
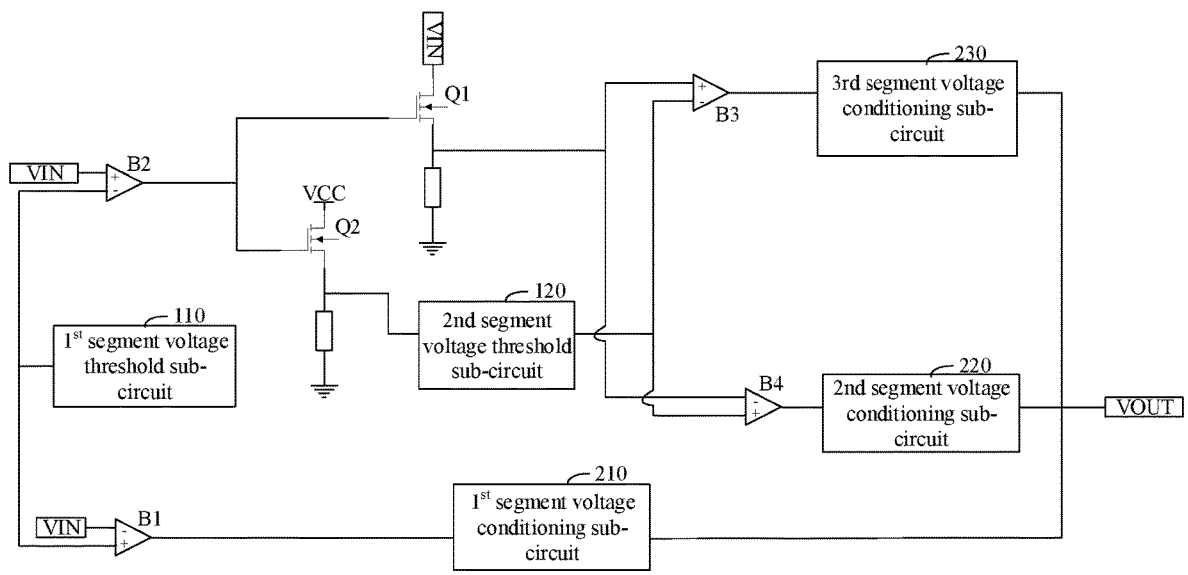
FIG. 3 is a third structural schematic view of a segmented selectable signal conditioning circuit according to an embodiment of the present disclosure.

In an embodiment, as shown in FIG. 3, the selection circuit 300 includes a first comparator B1, a second comparator B2, a third comparator B3, a fourth comparator B4, a first switching tube Q1, and a second switching tube Q2.

A first input terminal of the first comparator B1 is configured to receive the input voltage signal, a second input terminal of the first comparator B1 is connected to an output terminal of the first segment voltage threshold sub-circuit 110, and an output terminal of the first comparator B1 is connected to the first segment voltage conditioning sub-circuit 210. A power supply end of the first segment voltage threshold sub-circuit 110 is configured to connect to a direct current power supply VCC. A first input terminal of the second comparator B2 is connected to the output terminal of the first segment voltage threshold sub-circuit 110, a second input terminal of the second comparator B2 is configured to receive the input voltage signal, and an output terminal of the second comparator B2 is connected to a gate of the first switching tube Q1 and a gate of the second switching tube Q2. A first input terminal of the third comparator B3 is connected to an output terminal of the second segmented voltage threshold subcircuit 120, a second input terminal of the third comparator B3 is connected to a source of the first switching tube Q1, and an output terminal of the third comparator B3 is connected to the third segmented voltage conditioning subcircuit 230. A first input terminal of the fourth comparator B4 is connected to the source of the first switching tube Q1, a second input terminal of the fourth comparator B4 is connected to the output terminal of the second segmented voltage threshold subcircuit 120, and an output terminal of the fourth comparator B4 is connected to the second segmented voltage conditioning subcircuit 220. A drain of the first switching tube Q1 is connected to the input voltage signal. A drain of the second switching tube Q2 is connected to the direct current power supply VCC. A source of the second switching tube Q2 is connected to a power supply end of the second segmented voltage threshold sub-circuit 120

Each of the first comparator B1, the second comparator B2, the third comparator B3, and the fourth comparator B4 may be an operational comparator. Each of the first switching tube Q1 and the second switching tube Q2 may be a MOS tube. For example, each of the first switching tube Q1 and the second switching tube Q2 may be an N-type MOS tube.

For example, in the following illustration, each of the first comparator B1, the second comparator B2, the third comparator B3, and the fourth comparator B4 may be the operational comparator; and each of the first switching tube Q1 and the second switching tube Q2 is the N-type MOS tube. The first input terminal of the first comparator B1 refers to an inverting input terminal of the first comparator B1, and the second input terminal of the first comparator B1 refers to the in-phase input terminal of the first comparator B1. The first input terminal of the second comparator B2 refers to an inverting input terminal of the second comparator B2, and the second input terminal of the second comparator B2 refers to an in-phase input terminal of the second comparator B2. The first input terminal of the third comparator B3 refers to an inverting input terminal of the third comparator B3, and the second input terminal of the third comparator B3 refers to an in-phase input terminal of the third comparator B3. The first input terminal of the fourth comparator B4 refers to an inverting input terminal of the fourth comparator B4, and the second input terminal of the fourth comparator B4 refers to an in-phase input terminal of the fourth comparator B4.

Since the power supply end of the first segmented voltage threshold sub-circuit 110 is connected to the direct current power supply VCC, the first segmented voltage threshold sub-circuit 110 may divide a voltage of the direct current power supply VCC to output the first voltage threshold signal. Since the first input terminal of the first comparator B1 receive the input voltage signal, the second input terminal of the first comparator B1 receives the first voltage threshold signal, the first comparator B1 compares the voltage value of the input voltage signal to voltage value of the first voltage threshold signal. In response to the voltage value of the input voltage signal being greater than the voltage value of the first voltage threshold signal, the first segmented voltage conditioning sub-circuit 210 is disconnected. In response to the voltage value of the input voltage signal being less than the voltage value of the first voltage threshold signal, the first comparator B1 transmits the first conduction signal to the first segment voltage conditioning sub-circuit 210, such that the first segment voltage conditioning sub-circuit 210 conditions the input voltage signal based on the received first conduction signal to output the first output voltage signal. Exemplarily, the first conduction signal may be a high voltage level signal. For example, the first comparator B1 transmits a low voltage level signal to the first voltage conditioning sub-circuit 210 in response to the voltage value of the input voltage signal being greater than the voltage value of the first voltage threshold signal, such that the first voltage conditioning sub-circuit 210 remains being disconnected. The first comparator B1 transmits a high voltage level signal to the first voltage conditioning sub-circuit 210 in response to the voltage value of the input voltage signal being less than the voltage value of the first voltage threshold signal, such that the first voltage conditioning sub-circuit 210 is conducted and is operating.

Since the first input terminal of the second comparator B2 receives the first voltage threshold signal, the second input terminal of the second comparator B2 receives the input voltage signal, the second comparator B2 compares the voltage value of the input voltage signal to the voltage value of the first voltage threshold signal. In response to the voltage value of the input voltage signal being less than the voltage value of the first voltage threshold signal, each of the first switching tube Q1 and the second switching tube Q2 is disconnected, such that the second segmented voltage regulation sub-circuit 220 and the third segmented voltage regulation sub-circuit 230 are disconnected. The second comparator B2 controls the first switching tube Q1 and the second switching tube Q2 to be connected in response to the voltage value of the input voltage signal being greater than the voltage value of the first voltage threshold signal. For example, the second comparator B2 transmits the low voltage level signal to the gate of the first switching tube Q1 and the gate of the second switching tube Q2 in response to the voltage value of the input voltage signal being less than the voltage value of the first voltage threshold signal, such that the first switching tube Q1 and the second switching tube Q2 remain being disconnected. The second comparator B2 transmits the high voltage level signal to the gate of the first switching tube Q1 and the gate of the second switching tube Q2 in response to the voltage value of the input voltage signal being greater than the voltage value of the first voltage threshold signal, such that the first switching tube Q1 and the second switching tube Q2 are conducted and operating.

Since the drain of the second switching tube Q2 is connected to the direct current power supply VCC and the source of the second switching tube Q2 is connected to the power supply end of the second segmented voltage threshold sub-circuit 120, the second segmented voltage threshold sub-circuit 120 is conducted in response to the second switching tube Q2 being conducted, such that the second segmented voltage threshold sub-circuit 120 transmits the second voltage threshold signal to the first input terminal of the third comparator B3 and the second input terminal of the fourth comparator B4 respectively. Since the drain of the first switching tube Q1 is configured to receive the input voltage signal, the first switching tube Q1 is conducted in response to the second switching tube Q2 being conducted. In this case, the first input terminal of the third comparator B3 receives the second voltage threshold signal, and the second input terminal of the third comparator B3 receives the input voltage signal. Further, the third comparator B3 compares the voltage value of the input voltage signal and the voltage value of the second voltage threshold signal. The third segmented voltage conditioning sub-circuit 230 remains being disconnected in response to the voltage value of the input voltage signal being less than the voltage value of the second voltage threshold signal. The third comparator B3 transmits the third conduction signal to the third segmented voltage conditioning sub-circuit 230 in response to the voltage value of the input voltage signal being greater than the voltage value of the second voltage threshold signal, such that the third voltage conditioning circuit 230 conditions the input voltage signal based on the received third conduction signal to output the third output voltage signal.

Since the drain of the first switching tube Q1 is configured to receive the input voltage signal, the first switching tube Q1 is conducted in response to the second switching tube Q2 being conducted. In this case, the second input terminal of the fourth comparator B4 receives the second voltage threshold signal, and the first input terminal of the fourth comparator B4 receives the input voltage signal. Further, the fourth comparator B4 compares the voltage value of the input voltage signal to the voltage value of the second voltage threshold signal. The second segmented voltage conditioning sub-circuit 220 is disconnected in response to the voltage value of the input voltage signal being greater than the voltage value of the second voltage threshold signal. The fourth comparator B4 transmits the second conduction signal to the second segmented voltage conditioning sub-circuit 220 in response to the voltage value of the input voltage signal being less than the voltage value of the second voltage threshold signal, such that the second segmented voltage conditioning sub-circuit 220 conditions the input voltage signal based on the received second conduction signal to output the second output voltage signal.

In the above embodiment, the segmented voltage threshold circuit 100, the segmented voltage conditioning circuit 200, and the selection circuit 300. The selection circuit 300 includes the first comparator B1, the second comparator B2, the third comparator B3, the fourth comparator B4, the first switching tube Q1, and the second switching tube Q2. The input voltage signal is compared and processed by defining a plurality of input voltage ranges. When the voltage value of the input voltage signal falls into a corresponding input voltage range, the voltage conditioning sub-circuit corresponding to the range (the first voltage conditioning sub-circuit, the second voltage conditioning sub-circuit, and the third voltage conditioning sub-circuit) is conducted to achieve segmented and selectable voltage signal conditioning. In the present disclosure, the voltage signal conditioning is optimized, the voltage is automatically segmented and conditioned. The circuit may be flexibly adapted for multi-segment voltage conditioning. The applicable sampling range of the voltage sampling conditioning is increased, and the sampling accuracy and universality is improved. Therefore, scenarios that voltage sampling and conditioning are increased, and universality and accuracy of the circuit are improved.

Figure 4:
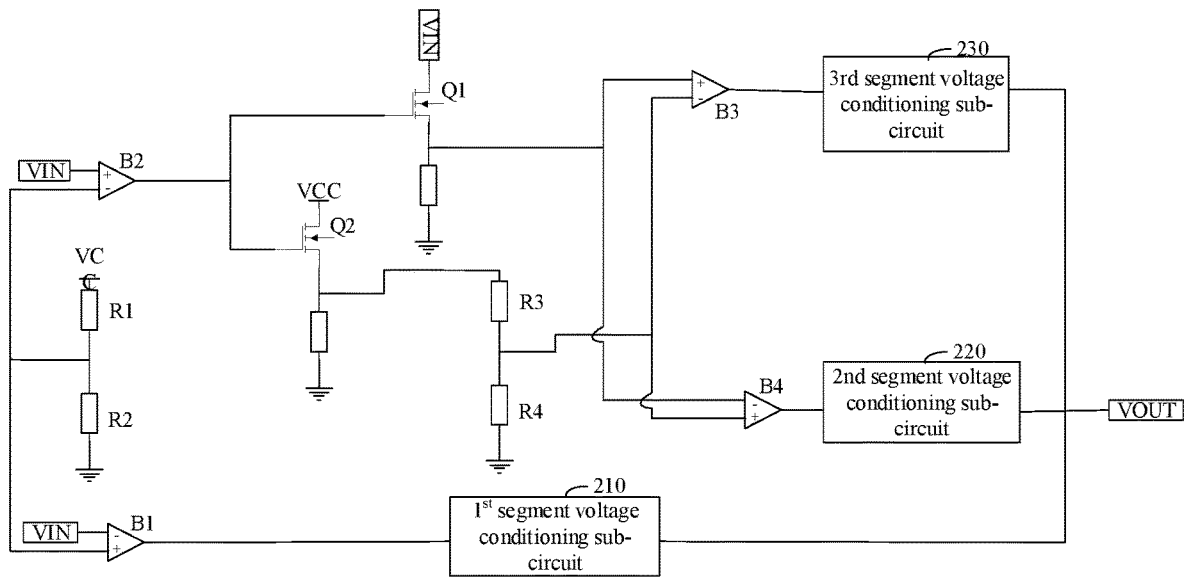
FIG. 4 is a fourth structural schematic view of a segmented selectable signal conditioning circuit according to an embodiment of the present disclosure.

In an example, as shown in FIG. 4, the first segment voltage threshold sub-circuit 110 includes a first resistor R1 and a second resistor R2. A first terminal of the first resistor R1 is connected to the direct current power supply VCC, a second terminal of the first resistor R1 is connected to a first terminal of the second resistor R2. A second terminal of the second resistor R2 is connected to the ground. The second input terminal of the first comparator B1 and the first input terminal of the second comparator B2 are connected between the first terminal of the first resistor R1 and the first terminal of the second resistor R2.

Due to the connection between the first resistor R1 and the second resistor R2, when a resistance value of the first resistor R1 is r1, a resistance value of the second resistor R2 is r2, and a voltage value of the direct current power supply VCC is vcc, the voltage threshold value of the first voltage threshold signal of the first segmented voltage threshold sub-circuit 110 is:

$$VTH1 = \frac{r2}{(r1 + r2)} vcc.$$

Exemplarily, each of the first resistor R1 and the second resistor R2 may be an adjustable resistor.

In an example, as shown in FIG. 4, the second segmented voltage threshold sub-circuit 120 includes a third resistor R3 and a fourth resistor R4. A first terminal of the third resistor R3 is connected to the source of the second switching tube Q2, and a second terminal of the third resistor R3 is connected to a first terminal of the fourth resistor R4. A second terminal of the fourth resistor R4 is connected to the ground. The first input terminal of the third comparator B3 and the second input terminal of the fourth comparator B4 are connected between the second terminal of the third resistor R3 and the first terminal of the fourth resistor R4.

Due to the connection between the third resistor R3 and the fourth resistor R4, when a resistance value of the third resistor R3 is r3, a resistance value of the fourth resistor R4 is r4, and a voltage value of the direct current power supply VCC is vcc, the voltage threshold value of the second voltage threshold signal of the second segmented voltage threshold sub-circuit 120 is:

$$VTH2 = \frac{r4}{(r3 + r4)} vcc.$$

Exemplarily, each of the third resistor R3 and the fourth resistor R4 may be an adjustable resistor.

Based on the voltage threshold value set for the first segment voltage threshold sub-circuit 110 and the voltage threshold value set for the second segment voltage threshold sub-circuit 120, a detection range of the input voltage (VIN) may be divided into three ranges as follows: a first range is VIN<VTH1; a second segment is VTH1<VIN<VTH2; and a third segment is VIN>VTH2.

Figure 5:
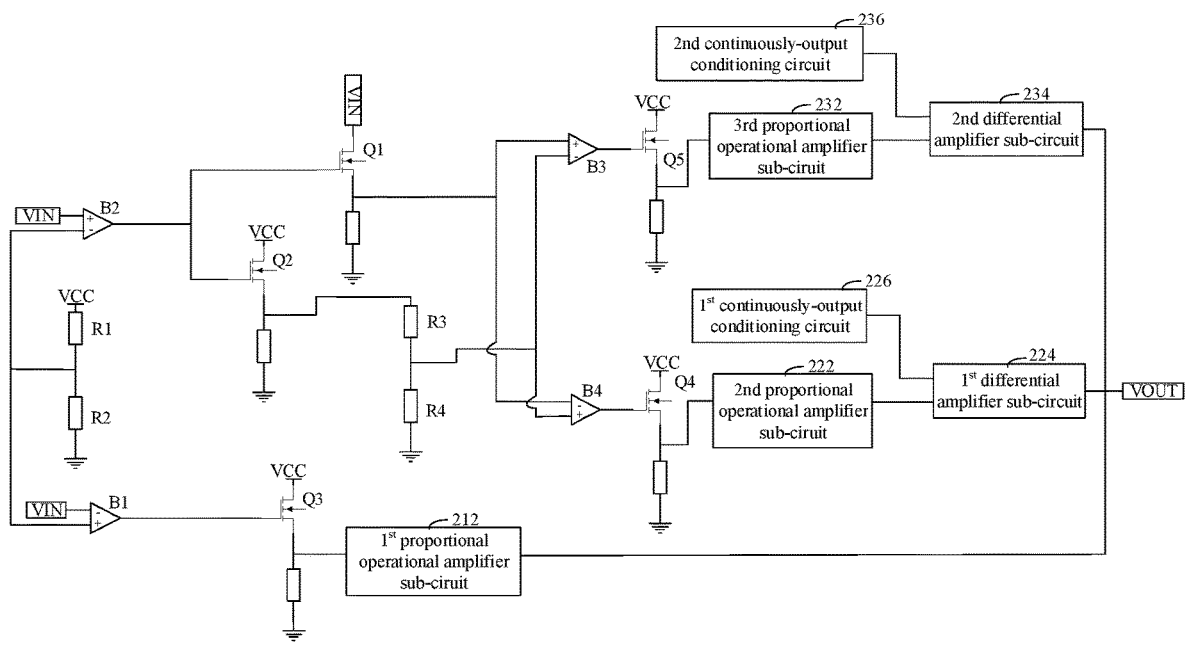
FIG. 5 is a fifth structural schematic view of a segmented selectable signal conditioning circuit according to an embodiment of the present disclosure.

In an example, as shown in FIG. 5, the first segmented voltage conditioning sub-circuit 210 includes a third switching tube Q3 and a first proportional operational amplifier sub-circuit 212. A gate of the third switching tube Q3 is connected to the output terminal of the first comparator B1, and a drain of the third switching tube Q3 is configured to access the input voltage signal. A source of the third switching tube Q3 is connected to an in-phase input terminal of the first proportional amplifier sub-circuit 212, an output terminal of the first proportional amplifier sub-circuit 212 is configured to output a first proportional amplified voltage signal.

The first proportional operational amplifier sub-circuit 212 is configured to amplify the input voltage signal in a first preset proportion.

When the voltage value VIN of the input voltage signal is less than the voltage threshold value VTH1 of the first voltage threshold signal, the first comparator B1 outputs the high voltage level signal (i.e., the first conduction signal), and the gate of the third switching tube Q3 receives the first conduction signal, and therefore, the third switching tube Q3 is conducted. The drain of the third switching tube Q3 is configured to access the input voltage signal. The source of the third switching tube Q3 is connected to the in-phase input terminal of the first proportional operational amplifier sub-circuit 212. In this way, the in-phase input terminal of the first proportional operational amplifier sub-circuit 212 receives the input voltage signal, and the input voltage signal is amplified by the first proportional operational amplifier sub-circuit 212 based on the first preset proportion, such that the first proportional amplified voltage signal is output.

In an example, as shown in FIG. 5, the second segmented voltage conditioning sub-circuit 220 includes a fourth switching tube Q4, a second proportional amplifier sub-circuit 222, a first differential amplifier sub-circuit 224, and a first continuously-output conditioning circuit 226. A gate of the fourth switching tube Q4 is connected to the output terminal of the fourth comparator B4, and a drain of the fourth switching tube Q4 is configured to access the input voltage signal. A source of the fourth switching tube Q4 is connected to an in-phase input terminal of the second proportional amplifier sub-circuit 222, and an output terminal of the second proportional amplifier sub-circuit 222 is configured to transmit a second proportional amplified voltage signal to an in-phase input terminal of the first differential amplifier sub-circuit 224. An inverting input terminal of the first differential amplifier circuit 224 is connected to the first continuously-output conditioning circuit 226. An output terminal of the first differential amplifier circuit 224 is configured to output the conditioned second proportional amplified voltage signal.

The second proportional operational amplifier sub-circuit 222 is configured to amplify the input voltage signal in a second preset proportion. The first differential amplifier sub-circuit 224 has circuit symmetry and may stabilize an operating point. The first continuously-output conditioning circuit 226 is configured to condition an output voltage, such that the output voltage continuous. For example, the first continuously-output conditioning circuit 226 is configured to output a first continuously-output conditioned signal.

When the voltage value VIN of the input voltage signal is greater than the voltage threshold value VTH1 of the first voltage threshold signal and is less than the voltage threshold value VTH2 of the second voltage threshold signal, the fourth comparator B4 outputs the high voltage level signal (i.e., the second conduction signal), and the gate of the fourth switching tube Q4 receives the second conduction signal, such that the fourth switching tube Q4 is conducted. The drain of the fourth switching tube Q4 is configured to access the input voltage signal. The source of the fourth switching tube Q4 is connected to the in-phase input terminal of the second proportional amplifier sub-circuit 222. In this way, the in-phase input terminal of the second proportional amplifier sub-circuit 222 receives the input voltage signal, and the input voltage signal is amplified by the second proportional amplifier sub-circuit 222 based on the second preset proportion, such that the second proportional amplified voltage signal is input to the in-phase input terminal of the first differential amplifier sub-circuit 224. Since the inverting input terminal of the first differential amplifier sub-circuit 224 is connected to the first continuously-output conditioning circuit 226, the inverting input terminal of the first differential amplifier sub-circuit 224 is connected to the first continuously-output conditioned signal. A differential amplification process is performed on the first continuously-output conditioned signal, such that the output terminal of the first differential amplifier sub-circuit 224 outputs the conditioned second proportional amplified voltage signal.

In an example, as shown in FIG. 5, the third segment voltage conditioning sub-circuit 230 includes a fifth switching tube Q5, a third proportional amplifier sub-circuit 232, a second differential amplifier sub-circuit 234, and a second continuously-output conditioning circuit 236. A gate of the fifth switching tube Q5 is connected to the output terminal of the third comparator B3, and a drain of the fifth switching tube Q5 is configured to access the input voltage signal. A source of the fifth switching tube Q5 is connected to an in-phase input terminal of the third proportional amplifier sub-circuit 232. An output terminal of the third proportional amplifier sub-circuit 232 is configured to transmit a third proportional amplified voltage signal to an in-phase input terminal of the second differential amplifier sub-circuit 234. An inverting input terminal of the second differential amplifier circuit 234 is connected to the second continuously-output adjustment circuit 236. An output terminal of the second differential amplifier circuit 234 is configured to output the conditioned third proportional amplified voltage signal.

The third proportional operational amplifier sub-circuit 232 is configured to amplify the input voltage signal in a third preset proportion. The second differential amplification sub-circuit 234 has circuit symmetry and may stabilize the operating point. The second continuously-output conditioning circuit 236 is configured to condition the output voltage, such that the output voltage is continuous. For example, the second continuously-output conditioning circuit 236 is configured to output a second continuously-output conditioned signal.

When the voltage value VIN of the input voltage signal is greater than the voltage threshold value VTH2 of the second voltage threshold signal, the third comparator B3 outputs the high voltage level signal (i.e., the third conduction signal), and the gate of the fifth switching tube Q5 receives the third conduction signal, such that the fifth switching tube Q5 is conducted. The drain of the fifth switching tube Q5 is configured to access the input voltage signal, and the source of the fifth switching tube Q5 is connected to the in-phase input terminal of the third proportional operational amplifier sub-circuit 232, such that the in-phase input terminal of the third proportional operational amplifier sub-circuit 232 receives the input voltage signal. The input voltage signal is amplified by the third proportional operational amplifier sub-circuit 232 based on a third preset proportion, such that the third proportional amplified voltage signal is transmitted to the in-phase input terminal of the second differential amplifier sub-circuit 234. The inverting input terminal of the second differential amplifier sub-circuit 234 is connected to the second continuously-output conditioning circuit 236, such that the inverting input terminal of the second differential amplifier sub-circuit 234 accesses the second continuously-output conditioning signal. The second continuously-output conditioning signal is differentially amplified by the second differential amplifier sub-circuit 234. In this way, the output terminal of the second differential amplifier sub-circuit 234 outputs the conditioned third proportional amplified voltage signal.

In the present disclosure, the voltage signal conditioning is optimized. The voltage signal is automatically segmented and conditioned. The circuit may be flexibly adapted for multi-segment voltage conditioning. The applicable sampling range of the voltage sampling conditioning is increased, and the sampling accuracy and universality is improved. By configuring the first continuously-output conditioning circuit 226 and the second continuously-output conditioning circuit 236, the voltage may be output continuously, the scenarios that voltage sampling conditioning can be applied may be increased, and universality and accuracy of sampling conditioning of the circuit may be improved.

Figure 6:
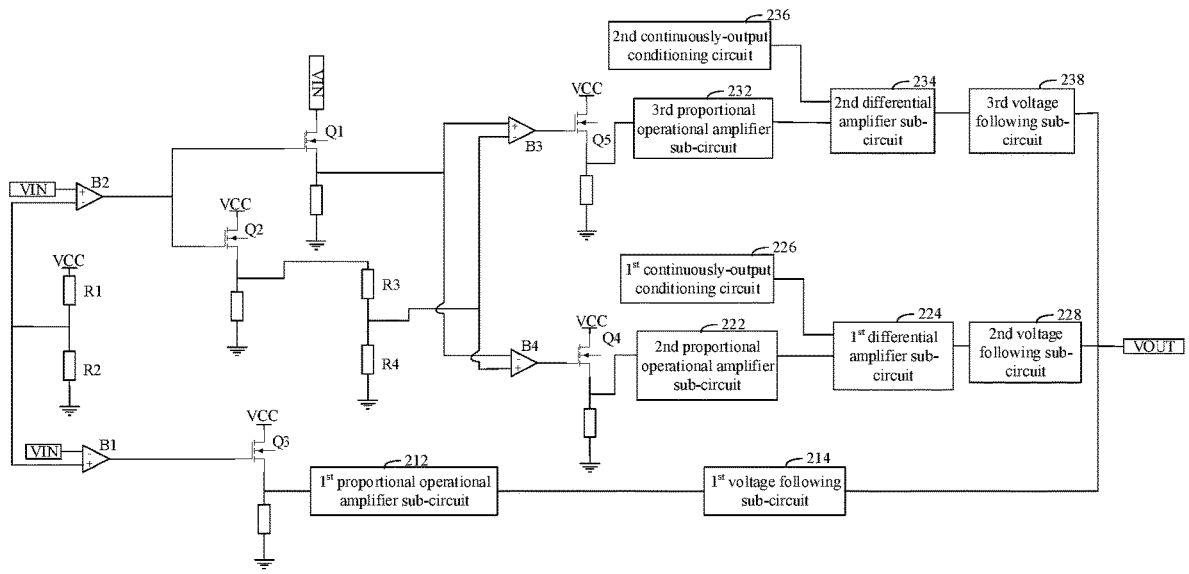
FIG. 6 is a sixth structural schematic view of a segmented selectable signal conditioning circuit according to an embodiment of the present disclosure.

In an example, as shown in FIG. 6, the first segment voltage conditioning sub-circuit 210 further includes a first voltage following sub-circuit 214. The second segment voltage conditioning sub-circuit 220 further includes a second voltage following sub-circuit 228. The third segmented voltage conditioning sub-circuit 230 further includes a third voltage following sub-circuit 238. An in-phase input terminal of the first voltage following sub-circuit 214 is connected to the output terminal of the first proportional amplifier sub-circuit 212. The in-phase input terminal of the second voltage following sub-circuit 228 is connected to the output terminal of the second differential amplifier sub-circuit 234. An in-phase input terminal of the second voltage following sub-circuit 228 is connected to the output terminal of the first differential amplifier sub-circuit 224. An in-phase input terminal of the third voltage following sub-circuit 238 is connected to the output terminal of the second differential amplifier sub-circuit 234.

Since the in-phase input terminal of the first voltage following sub-circuit 214 connected to the output terminal of the first proportional amplifier sub-circuit 212, the first voltage following sub-circuit 214 serves as a buffering isolation, such that the first proportional amplifier sub-circuit 212 and any circuit after the first proportional amplifier sub-circuit 212 do not affect each other, reliability of voltage signal conditioning may be improved. Since the in-phase input terminal of the second voltage following sub-circuit 228 is connected to the output terminal of the first differential amplifier sub-circuit 224, the second voltage following sub-circuit 228 serves as a buffering isolation, such that the first differential amplifier sub-circuit 224 and any circuit connected after the first differential amplifier sub-circuit 224 do not affect each other, and reliability of the voltage signal conditioning may be improved. Since the in-phase input terminal of the third voltage following sub-circuit 238 is connected to the output terminal of the second differential amplifier sub-circuit 234, the third voltage following sub-circuit 238 serves as a buffering isolation, such that the second differential amplifier sub-circuit 234 and any circuit connected after the second differential amplifier sub-circuit 234 do not affect each other, and reliability of voltage signal conditioning may be improved.

Figure 7:
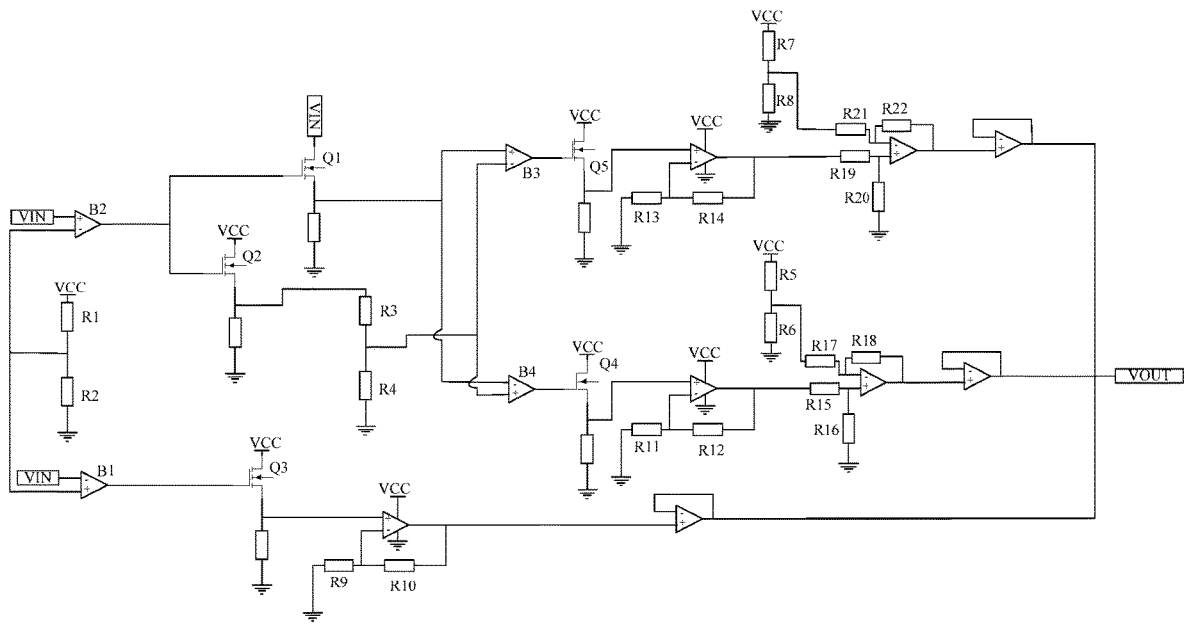
FIG. 7 is a seventh structural schematic view of a segmented selectable signal conditioning circuit according to an embodiment of the present disclosure.

In an example, as shown in FIG. 7, the first continuously-output conditioning circuit 226 includes a fifth resistor R5 and a sixth resistor R6. The second continuously-output conditioning circuit 236 includes a seventh resistor R7 and an eighth resistor R8.

A first terminal of the fifth resistor R5 is connected to the direct current power supply VCC. A second terminal of the fifth resistor R5 is connected to a first terminal of the sixth resistor R6. A second terminal of the sixth resistor R6 is connected to the ground. The inverting input terminal of the first differential amplifier sub-circuit 224 is connected between the second terminal of the fifth resistor R5 and the first terminal of the sixth resistor R6. A first terminal of the seventh resistor R7 is connected to the direct current power supply VCC. A second terminal of the seventh resistor R7 is connected to a first terminal of the eighth resistor R8. A second terminal of the eighth resistor R8 is connected to the ground. The inverting input terminal of the second differential amplifier sub-circuit 234 is connected between the second terminal of the seventh resistor R7 and the first terminal of the eighth resistor R8.

Due to the connection between the fifth resistor R5 and the sixth resistor R6, when a resistance value of the fifth resistor R5 is r5, a resistance value of the sixth resistor R6 is r6, and a voltage value of the direct current power supply VCC is vcc, a voltage conditioning value of the first continuously-output conditioning signal of the first continuously-output conditioning circuit 226 is $$VTH3 = \frac{r6}{(r5 + r6)} vcc.$$

Due to the connection between the seventh resistor R7 and the eighth resistor R8, when a resistance value of the seventh resistor R7 is r7, a resistance value of the eighth resistor R8 is r8, and a voltage value of the direct current power supply VCC is vcc, a voltage conditioning value of the second continuously-output conditioning signal of the second continuously-output conditioning circuit 236 is:

$$VTH4 = \frac{8}{(r7 + r8)} vcc.$$

Exemplarily, each of the fifth resistor R5 and the sixth resistor R6 may be an adjustable resistor; and each of the seventh resistor R7 and the eighth resistor R8 may be an adjustable resistor.

In an example, as shown in FIG. 7, the first segmented voltage threshold sub-circuit 110 includes the first resistor R1 and the second resistor R2. The second segmented voltage threshold sub-circuit 120 includes the third resistor R3 and the fourth resistor R4. A resistance value of the first resistor R1 is r1. A resistance value of the second resistor R2 is r2. A resistance value of the third resistor R3 is r3. A resistance value of the fourth resistor R4 is r4. A resistance value of the fifth resistor R5 is r5. A resistance value of the sixth resistor R6 is r6. A resistance value of the seventh resistor R7 is r7. A resistance value of the eighth resistor R8 is r8. A voltage of the direct current power supply VCC is vcc.

By setting the resistance value r1 for the first resistor R1, setting the resistance value r2 for the second resistor R2, setting the resistance value r3 for the third resistor R3, and setting the resistance value r4 for the fourth resistor R4, the voltage threshold value VTH1 may be set for the first voltage threshold signal, and the voltage threshold value VTH2 may be set for the second voltage threshold signal as follows:

$$VTH1 = \frac{r2}{(r1+r2)}vcc; \text{ and}$$

$$VTH2 = \frac{r4}{(r3+r4)}vcc.$$

The selection circuit 300 compares the input voltage value VIN to the voltage threshold value VTH1 of the first voltage threshold signal and the voltage threshold value VTH2 of the second voltage threshold signal. When VIN<VTH1, the third switching tube Q3 of the first voltage conditioning sub-circuit 210 is closed (connected), and the first switching tube Q1 and the second switching tube Q2 are both open (disconnected). In this case, the first voltage conditioning sub-circuit 210 is conducted and operating, and the second voltage conditioning sub-circuit 220 and the third voltage conditioning sub-circuit 230 are open (disconnected) and are not operating. When VTH1<VIN<VTH2, the first switching tube Q1, the second switching tube Q2, and the fourth switching tube Q4 are closed, and the third switching tube Q3 and the fifth switching tube Q5 are open. In this case, the second segment voltage conditioning circuit 220 is conducted and operating, and the first segment voltage conditioning circuit 210 and the third segment voltage conditioning circuit 230 are open and are not operating. When VTH2<VIN, the first switching tube Q1, the second switching tube Q2 and the fifth switching tube Q5 are closed, the third switching tube Q3 and the fifth switching tube Q4 are open. In this case, the third segment voltage conditioning circuit 230 is conducted and operating, and the first voltage conditioning sub-circuit 210 and the second voltage conditioning sub-circuit 220 are open and are not operating.

In detail, as shown in FIG. 7, the first proportional operational amplifier sub-circuit 212 includes a first operational amplifier, a ninth resistor R9 (having a resistance value of r9), and a tenth resistor R10 (having a resistance value of r10). The second proportional operational amplifier sub-circuit 222 includes a second operational amplifier, an eleventh resistor R11 (having a resistance value of r11), and a twelfth resistor R12 (having a resistance value of r12). The third proportional operational amplifier sub-circuit 232 includes a third operational amplifier, a thirteenth resistor R13 (having a resistance value of r13), and a fourteenth resistor R14 (having a resistance value of r14). The first differential amplifier sub-circuit 224 includes a fourth operational amplifier, a fifteenth resistor R15 (having a resistance value of r15), a sixteenth resistor R16 (having a resistance value of r16), a seventeenth resistor R17 (having a resistance value of r17), and an eighteenth resistor R18 (having a resistance value of r18). The second differential amplifier sub-circuit 234 includes a fifth operational amplifier, a nineteenth resistor R19 (having a resistance value of r19), a twentieth resistor R20 (having a resistance value of r20), a twenty-first resistor R21 (having a resistance value of r21), and a twenty-second resistor R22 (having a resistance value of r22).

When VIN<VTH1, the third switching tube Q3 of the first voltage conditioning sub-circuit 210 is closed, and the first switching tube Q1 and the second switching tube Q2 are open. In this case, the first voltage conditioning sub-circuit 210 is conducted and operating, and the second voltage conditioning sub-circuit 220 and the third voltage conditioning sub-circuit 230 are disconnected and are not operating, such that the output voltage is:

$$VOUT = \left(1 + \frac{r10}{r9}\right)VIN.$$

To be noted that, the output voltage may be biased and proportionally amplified based on demands.

When VTH1<VIN<VTH2, the first switching tube Q1, the second switching tube Q2 and the fourth switching tube Q4 are closed, and the third switching tube Q3 and the fifth switching tube Q5 are open. In this case, the second segment voltage conditioning sub-circuit 220 is conducted and operating, the first segment voltage conditioning sub-circuit 210 and the third segment voltage conditioning sub-circuit 230 are disconnected and are not operating. When r15=r16=r17=r18, the output voltage is:

$$VOUT = \left(1 + \frac{r12}{r11}\right)VIN - VTH3.$$

In order to allow the voltage to be output continuously, the VTH3 voltage is set to be:

$$VTH3 = \left(1 + \frac{r12}{r11}\right)VIN - \left(1 + \frac{r10}{r9}\right)VIN = \frac{r6}{r5+r6} \times VCC.$$

Further, the output voltage is:

$$VOUT = \left(1 + \frac{r12}{r11}\right)VIN - \frac{r6}{(r5+r6)} \times VCC.$$

When VTH2<VIN, the first switching tube Q1, the second switching tube Q2 and the fifth switching tube Q5 are all closed, the third switching tube Q3 and the fourth switching tube Q4 are all open. In this case, the third segment voltage conditioning sub-circuit 230 is conducted and operating, and the first segment voltage conditioning sub-circuit 210 and the second segment voltage conditioning sub-circuit 220 are disconnected and are not operating. When r19=r20=r21=r22, $$VOUT = \left(1 + \frac{r13}{r14}\right)VIN - VTH4.$$

In order to allow the voltage to be output continuously, the VTH4 voltage is set to be $$VTH4 = \left(1 + \frac{r14}{r13}\right)VIN - \left(1 + \frac{r12}{r11}\right)VIN = \frac{8}{r7+r8} \times VCC,$$

such that the output voltage is:

$$VOUT = \left(1 + \frac{r13}{r14}\right)VIN - \frac{8}{r7+r8} \times VCC.$$

That is, the input voltage VIN is conditioned, and an output result of the conditioning is:

$$VOUT = \begin{cases} \left(1 + \dfrac{r10}{r9}\right) VIN, & VIN < VTH1 \\ \left(1 + \dfrac{r12}{r11}\right) VIN - \dfrac{r6}{r5 + r6} \times VCC, & VTH1 < VIN < VTH2 \\ \left(1 + \dfrac{r14}{r13}\right) VIN - \dfrac{r8}{r7 + r8} \times VCC, & VTH2 < VIN \end{cases}$$

To be noted that a similar concept allows multi-segment (such as four segments, five segments, six segments, and so on) voltage continuous signal conditioning to be achieved.

In the above embodiments, the input voltage is divided in to a plurality of ranges, and the input voltage signal is compared and processed. When the voltage value of the input voltage signal falls into a certain input voltage range, a voltage conditioning sub-circuit corresponding to the certain range (the first voltage conditioning sub-circuit, the second voltage conditioning sub-circuit, and the third voltage conditioning sub-circuit) is conducted to achieve segmented selectable voltage signal conditioning. In the present disclosure, the voltage signal conditioning is optimized, the voltage is automatically segmented and conditioned. The circuit may be flexibly adapted for multi-segment voltage conditioning. The applicable sampling range of the voltage sampling conditioning is increased, and the sampling accuracy and universality is improved. Therefore, scenarios that voltage sampling and conditioning are increased, and universality and accuracy of the circuit are improved.

In an embodiment, a signal measurement device is provided. The signal measurement device includes a segmented selectable signal conditioning circuit as mentioned in any of the above embodiments.

Details of the segmented selectable signal conditioning circuit may refer to the description of the above embodiments, and will not be repeated here.

Technical features of the above embodiments may be combined in various ways. In order to provide a concise description, not all possible combinations of the technical features of the above embodiments are described. However, as long as a combination of technical features does not generate conflict, the combination shall be considered to be within the scope of the present disclosure.

The above described embodiments show only some embodiments of the present application, which are described in a more specific and detailed manner, but the description shall not be interpreted as limiting the scope of the present disclosure. To be noted that, for any ordinary skilled person in the art, various variations and improvements may be made without departing from the concept of the present disclosure, and the variations and improvements shall fall within the scope of the present disclosure. Therefore, the scope of the present disclosure shall be governed by the attached claims.

What is claimed is:

1. A signal conditioning circuit, comprising:
   a segmented voltage threshold circuit, comprising X segmented voltage threshold sub-circuits, wherein the X segmented voltage threshold sub-circuits is configured to output X voltage threshold signals, and the X voltage threshold signals have different threshold values, and X is an integer greater than or equal to 1;
   a selection circuit, connected to the segmented voltage threshold circuit and configured to receive an input voltage signal and the X voltage threshold signals and output X+1 conduction signals, wherein each conduction signal of the X+1 conduction signals is output based on a comparison result between the input voltage signal and one of the X voltage threshold signals; and
   a segmented voltage conditioning circuit, connected to the selection circuit and comprising X+1 segmented voltage conditioning sub-circuits, wherein each of the X+1 segmented voltage conditioning sub-circuits is configured to condition the input voltage signal to output a corresponding output voltage signal based on a corresponding conduction signal of the X+1 conduction signals;
   wherein the segmented voltage conditioning circuit comprises a proportional operational amplifier sub-circuit, configured to amplify the input voltage signal in a preset proportion.

2. The signal conditioning circuit according to claim 1, wherein
   X is equal to 2;
   the X segmented voltage threshold sub-circuits comprise a first segmented voltage threshold sub-circuit and a second segmented voltage threshold sub-circuit, the X voltage threshold signals comprise a first voltage threshold signal and a second voltage threshold signal, and a threshold value of the first voltage threshold signal is less than a threshold value of the second voltage threshold signal, wherein the first segmented voltage threshold sub-circuit is configured to output the first voltage threshold signal, the second segmented voltage threshold sub-circuit is configured to output the second voltage threshold signal;
   the X+1 conduction signals comprise a first conduction signal, a second conduction signal, and a third conduction signal, wherein the first conduction signal is output in response to a voltage value of the input voltage signal being less than the threshold value of the first voltage threshold signal, the second conduction signal is output in response to a voltage value of the input voltage signal being greater than the threshold value of the first voltage threshold signal and less than the threshold value of the second voltage threshold signal, and the third conduction signal is output in response to a voltage value of the input voltage signal being greater than the threshold value of the second voltage threshold signal;
   the X+1 segmented voltage conditioning sub-circuits comprise a first segmented voltage conditioning sub-circuit, a second segmented voltage conditioning sub-circuit, and a third segmented voltage conditioning sub-circuit, wherein the first segmented voltage conditioning sub-circuit is configured to condition the input voltage signal to output a first output voltage signal based on the first conduction signal, the second segmented voltage conditioning sub-circuit is configured to condition the input voltage signal to output a second output voltage signal based on the second conduction signal, and the third segmented voltage conditioning sub-circuit is configured to condition the input voltage signal to output a third output voltage signal based on the third conduction signal.

3. The signal conditioning circuit according to claim 2, wherein
   the proportional operational amplifier sub-circuit comprises a first proportional operational amplifier sub-circuit, a second proportional operational amplifier sub-circuit, and a third proportional operational amplifier sub-circuit the first segmented voltage conditioning sub-circuit comprises a third switching tube and the first proportional operational amplifier sub-circuit, wherein a gate of the third switching tube is connected to the selection circuit, a source of the third switching tube is connected to an input terminal of the first proportional operational amplifier sub-circuit, and an output terminal of the first proportional operational amplifier sub-circuit is configured to output a first proportional amplified voltage signal;

the second segmented voltage conditioning sub-circuit comprises a fourth switching tube and the second proportional operational amplifier sub-circuit, wherein a gate of the fourth switching tube is connected to the selection circuit, a source of the fourth switching tube is connected to an input terminal of the second proportional operational amplifier sub-circuit, and an output terminal of the second proportional operational amplifier sub-circuit is configured to output a second proportional amplified voltage signal;

the third segmented voltage conditioning sub-circuit comprises a fifth switching tube and the third proportional operational amplifier sub-circuit, wherein a gate of the fifth switching tube is connected to the selection circuit, a source of the fifth switching tube is connected to an input terminal of the third proportional operational amplifier sub-circuit, and an output terminal of the third proportional operational amplifier sub-circuit is configured to output a third proportional amplified voltage signal.

4. The signal conditioning circuit according to claim 3, wherein the second segmented voltage conditioning sub-circuit further comprises a first differential amplifier sub-circuit and a first continuously-output conditioning circuit, wherein a first input terminal of the first differential amplifier sub-circuit is connected to the output terminal of the second proportional operational amplifier sub-circuit, a second input terminal of the first differential amplifier sub-circuit is connected to the first continuously-output conditioning circuit, and an output terminal of the first differential amplifier sub-circuit is configured to output a conditioned second proportional amplification voltage signal which is obtained as the second proportional amplification voltage signal is conditioned;

the third segmented voltage conditioning sub-circuit further comprises a second differential amplifier sub-circuit and a second continuously-output conditioning circuit, wherein a first input terminal of the second differential amplifier sub-circuit is connected to the output terminal of the third proportional operational amplifier sub-circuit, a third input terminal of the second differential amplifier sub-circuit is connected to the second continuously-output conditioning circuit, and an output terminal of the second differential amplifier sub-circuit is configured to output a conditioned third proportional amplification voltage signal which is obtained as the third proportional amplification voltage signal is conditioned.

5. The signal conditioning circuit according to claim 4, wherein the first proportional operational amplifier sub-circuit comprises a first proportional operational amplifier, a ninth resistor, and a tenth resistor, wherein a positive input terminal of the first proportional operational amplifier is used as the input terminal of the first proportional operational amplifier sub-circuit, a negative input terminal of the first proportional operational amplifier is connected to one terminal of the ninth resistor and one terminal of the tenth resistor, another terminal of the ninth resistor is grounded, and another terminal of the tenth resistor is connected to an output terminal of the first proportional operational amplifier;

the second proportional operational amplifier sub-circuit comprises a second proportional operational amplifier, an eleventh resistor, and a twelfth resistor, wherein a positive input terminal of the second proportional operational amplifier is used as the input terminal of the second proportional operational amplifier sub-circuit, a negative input terminal of the second proportional operational amplifier is connected to one terminal of the eleventh resistor and one terminal of the twelfth resistor, another terminal of the eleventh resistor is grounded, and another terminal of the twelfth resistor is connected to an output terminal of the second proportional operational amplifier;

the third proportional operational amplifier sub-circuit comprises a third proportional operational amplifier, a thirteenth resistor, and a fourteenth resistor, wherein a positive input terminal of the third proportional operational amplifier is used as the input terminal of the third proportional operational amplifier sub-circuit, a negative input terminal of the third proportional operational amplifier is connected to one terminal of the thirteenth resistor and one terminal of the fourteenth resistor, another terminal of the thirteenth resistor is grounded, and another terminal of the fourteenth resistor is connected to an output terminal of the third proportional operational amplifier.

6. The signal conditioning circuit according to claim 4, wherein the first continuously-output conditioning circuit comprises a fifth resistor and a sixth resistor which are series-connected, one end of the series-connected fifth resistor and the sixth resistor is connected to a DC power supply and another end of the series-connected fifth resistor and the sixth resistor is grounded;

the first differential amplifier sub-circuit comprises a first differential amplifier, a fifteenth resistor, a sixteenth resistor, an seventeenth resistor, and an eighteenth resistor, wherein a positive input terminal of the first differential amplifier is connected to one terminal of the fifteenth resistor and one terminal of the sixteenth resistor, another terminal of the fifteenth resistor is connected to the output terminal of the second proportional operational amplifier sub-circuit, another terminal of the sixteenth resistor is grounded, a negative input terminal of the first differential amplifier is connected to one terminal of the seventeenth resistor and one terminal of the eighteenth resistor, another terminal of the seventeenth resistor is connected between the third resistor and the fourth resistor, and another terminal of the eighteenth resistor is connected to an output terminal of the first differential amplifier;

the second continuously-output conditioning circuit comprises a seventh resistor and an eighth resistor which are series-connected, one end of the series-connected seventh resistor and the eighth resistor is connected to a DC power supply and another end of the series-connected seventh resistor and the eighth resistor is grounded;

the second differential amplifier sub-circuit comprises a second differential amplifier, a nineteenth resistor, a twentieth resistor, a twenty-first resistor, and a twenty-second resistor, wherein a positive input terminal of the second differential amplifier is connected to one terminal of the nineteenth resistor and one terminal of the twentieth resistor, another terminal of the nineteenth resistor is connected to the output terminal of the second proportional operational amplifier sub-circuit, another terminal of the twentieth resistor is grounded, a negative input terminal of the second differential amplifier is connected to one terminal of the twenty-first resistor and one terminal of the twenty-second resistor, another terminal of the twenty-first resistor is connected between the third resistor and the fourth resistor, and another terminal of the twenty-second resistor is connected to an output terminal of the second differential amplifier.

7. The signal conditioning circuit according to claim 6, wherein the fifteenth resistor, the sixteenth resistor, the seventeenth resistor, and the eighteenth resistor have the same resistor value;
the nineteenth resistor, the twentieth resistor, the twenty-first resistor, and the twenty-second resistor have the same resistor value.

8. The signal conditioning circuit according to claim 2, wherein
the first segmented voltage threshold sub-circuit comprises a first resistor and a second resistor which are series-connected, wherein one end of the series-connected first resistor and the second resistor is connected to a DC power supply and another end of the series-connected first resistor and the second resistor is grounded;
the second segmented voltage threshold sub-circuit comprises a third resistor and a fourth resistor which are series-connected, wherein one end of the series-connected third resistor and the fourth resistor is connected to the DC power supply through the selection circuit and another end of the series-connected third resistor and the fourth resistor is grounded.

9. The signal conditioning circuit according to claim 8, wherein
the selection circuit comprises a first comparator, a second comparator, a third comparator, a fourth comparator, a first switching tube, and a second switching tube;
wherein a first input terminal of the first comparator is used to receive the input voltage signal, a second input terminal of the first comparator is connected to the first segmented voltage threshold sub-circuit, an output terminal of the first comparator is connected to the first segmented voltage conditioning sub-circuit;
a first input terminal of the second comparator is connected to the first segmented voltage threshold sub-circuit, a second input terminal of the second comparator is used to receive the input voltage signal, and an output terminal of the second comparator is connected to a gate of the first switching tube and a gate of the second switching tube;
a first input terminal of the third comparator is connected to the second segmented voltage threshold sub-circuit, a second input terminal of the second comparator is connected to a source of the first switching tube, and an output terminal of the third comparator is connected to the third segmented voltage conditioning sub-circuit;
a first input terminal of the fourth comparator is connected to a source of the first switching tube, a second input terminal of the fourth comparator is connected to the second segmented voltage threshold sub-circuit, an output terminal of the fourth comparator is connected to the second segmented voltage conditioning sub-circuit;
the source of the first switching tube is further grounded, a drain of the first switching tube is used to receive the input voltage signal;
a source of the second switching tube is grounded and connected to the one end of the series-connected third resistor and the fourth resistor, a drain of the second switching tube is connected to the DC power supply.

10. The signal conditioning circuit according to claim 3, wherein
the first segmented voltage conditioning sub-circuit further comprises a first voltage following sub-circuit, wherein a positive input terminal of the first voltage following sub-circuit is connected to the output terminal of the first proportional operational amplifier sub-circuit, and a negative input terminal of the first voltage following sub-circuit is connected to the output terminal of the first voltage following sub-circuit;
the second segmented voltage conditioning sub-circuit further comprises a second voltage following sub-circuit, wherein a positive input terminal of the second voltage following sub-circuit is connected to the output terminal of the second proportional operational amplifier sub-circuit, and a negative input terminal of the second voltage following sub-circuit is connected to the output terminal of the second voltage following sub-circuit;
the third segmented voltage conditioning sub-circuit further comprises a third voltage following sub-circuit, wherein a positive input terminal of the third voltage following sub-circuit is connected to the output terminal of the third proportional operational amplifier sub-circuit, and a negative input terminal of the third voltage following sub-circuit is connected to the output terminal of the third voltage following sub-circuit.

11. A signal measurement device, comprising:
a signal conditioning circuit, comprising:
a segmented voltage threshold circuit, comprising X segmented voltage threshold sub-circuits, wherein the X segmented voltage threshold sub-circuits is configured to output X voltage threshold signals, and the X voltage threshold signals have different threshold values, and X is an integer greater than or equal to 1;
a selection circuit, connected to the segmented voltage threshold circuit and configured to receive an input voltage signal and the X voltage threshold signals and output X+1 conduction signals, wherein each conduction signal of the X+1 conduction signals is output based on a comparison result between the input voltage signal and one of the X voltage threshold signals; and
a segmented voltage conditioning circuit, comprising X+1 segmented voltage conditioning sub-circuits, wherein each of the X+1 segmented voltage conditioning sub-circuit is configured to condition the input voltage signal to output a corresponding output voltage signal based on a corresponding conduction signal of the X+1 conduction signals;
wherein the segmented voltage conditioning circuit comprises a proportional operational amplifier sub-circuit, configured to amplify the input voltage signal in a preset proportion.

12. The signal measurement device according to claim 11, wherein
X is equal to 2;

the X segmented voltage threshold sub-circuits comprise a first segmented voltage threshold sub-circuit and a second segmented voltage threshold sub-circuit, the X voltage threshold signals comprise a first voltage threshold signal and a second voltage threshold signal, and a threshold value of the first voltage threshold signal is less than a threshold value of the second voltage threshold signal, wherein the first segmented voltage threshold sub-circuit is configured to output the first voltage threshold signal, the second segmented voltage threshold sub-circuit is configured to output the second voltage threshold signal;

the X+1 conduction signals comprise a first conduction signal, a second conduction signal, and a third conduction signal, wherein the first conduction signal is output in response to a voltage value of the input voltage signal being less than the threshold value of the first voltage threshold signal, the second conduction signal is output in response to a voltage value of the input voltage signal being greater than the threshold value of the first voltage threshold signal and less than the threshold value of the second voltage threshold signal, and the third conduction signal is output in response to a voltage value of the input voltage signal being greater than the threshold value of the second voltage threshold signal;

the X+1 segmented voltage conditioning sub-circuits comprise a first segmented voltage conditioning sub-circuit, a second segmented voltage conditioning sub-circuit, and a third segmented voltage conditioning sub-circuit, wherein the first segmented voltage conditioning sub-circuit is configured to condition the input voltage signal to output a first output voltage signal based on the first conduction signal, the second segmented voltage conditioning sub-circuit is configured to condition the input voltage signal to output a second output voltage signal based on the second conduction signal, and the third segmented voltage conditioning sub-circuit is configured to condition the input voltage signal to output a third output voltage signal based on the third conduction signal.

13. The signal measurement device according to claim 12, wherein the proportional operational amplifier sub-circuit comprises a first proportional operational amplifier sub-circuit, a second proportional operational amplifier sub-circuit, and a third proportional operational amplifier sub-circuit;

the first segmented voltage conditioning sub-circuit comprises a third switching tube and the first proportional operational amplifier sub-circuit, wherein a gate of the third switching tube is connected to the selection circuit, a source of the third switching tube is connected to an input terminal of the first proportional operational amplifier sub-circuit, and an output terminal of the first proportional operational amplifier sub-circuit is configured to output a first proportional amplified voltage signal;

the second segmented voltage conditioning sub-circuit comprises a fourth switching tube and the second proportional operational amplifier sub-circuit, wherein a gate of the fourth switching tube is connected to the selection circuit, a source of the fourth switching tube is connected to an input terminal of the second proportional operational amplifier sub-circuit, and an output terminal of the second proportional operational amplifier sub-circuit is configured to output a second proportional amplified voltage signal;

the third segmented voltage conditioning sub-circuit comprises a fifth switching tube and the third proportional operational amplifier sub-circuit, wherein a gate of the fifth switching tube is connected to the selection circuit, a source of the fifth switching tube is connected to an input terminal of the third proportional operational amplifier sub-circuit, and an output terminal of the third proportional operational amplifier sub-circuit is configured to output a third proportional amplified voltage signal.

14. The signal measurement device according to claim 13, wherein the second segmented voltage conditioning sub-circuit further comprises a first differential amplifier sub-circuit and a first continuously-output conditioning circuit, wherein a first input terminal of the first differential amplifier sub-circuit is connected to the output terminal of the second proportional operational amplifier sub-circuit, a second input terminal of the first differential amplifier sub-circuit is connected to the first continuously-output conditioning circuit, and an output terminal of the first differential amplifier sub-circuit is configured to output a conditioned second proportional amplification voltage signal which is obtained as the second proportional amplification voltage signal is conditioned;

the third segmented voltage conditioning sub-circuit further comprises a second differential amplifier sub-circuit and a second continuously-output conditioning circuit, wherein a first input terminal of the second differential amplifier sub-circuit is connected to the output terminal of the third proportional operational amplifier sub-circuit, a third input terminal of the second differential amplifier sub-circuit is connected to the second continuously-output conditioning circuit, and an output terminal of the second differential amplifier sub-circuit is configured to output a conditioned third proportional amplification voltage signal which is obtained as the third proportional amplification voltage signal is conditioned.

15. The signal measurement device according to claim 14, wherein the first proportional operational amplifier sub-circuit comprises a first proportional operational amplifier, a ninth resistor, and a tenth resistor, wherein a positive input terminal of the first proportional operational amplifier is used as the input terminal of the first proportional operational amplifier sub-circuit, a negative input terminal of the first proportional operational amplifier is connected to one terminal of the ninth resistor and one terminal of the tenth resistor, another terminal of the ninth resistor is grounded, and another terminal of the tenth resistor is connected to an output terminal of the first proportional operational amplifier;

the second proportional operational amplifier sub-circuit comprises a second proportional operational amplifier, an eleventh resistor, and a twelfth resistor, wherein a positive input terminal of the second proportional operational amplifier is used as the input terminal of the second proportional operational amplifier sub-circuit, a negative input terminal of the second proportional operational amplifier is connected to one terminal of the eleventh resistor and one terminal of the twelfth resistor, another terminal of the eleventh resistor is grounded, and another terminal of the twelfth resistor is connected to an output terminal of the second proportional operational amplifier;

the third proportional operational amplifier sub-circuit comprises a third proportional operational amplifier, a thirteenth resistor, and a fourteenth resistor, wherein a positive input terminal of the third proportional operational amplifier is used as the input terminal of the third proportional operational amplifier sub-circuit, a negative input terminal of the third proportional operational amplifier is connected to one terminal of the thirteenth resistor and one terminal of the fourteenth resistor, another terminal of the thirteenth resistor is grounded, and another terminal of the fourteenth resistor is connected to an output terminal of the third proportional operational amplifier.

16. The signal measurement device according to claim 14, wherein the first continuously-output conditioning circuit comprises a fifth resistor and a sixth resistor which are series-connected, one end of the series-connected fifth resistor and the sixth resistor is connected to a DC power supply and another end of the series-connected fifth resistor and the sixth resistor is grounded;

the first differential amplifier sub-circuit comprises a first differential amplifier, a fifteenth resistor, a sixteenth resistor, an seventeenth resistor, and an eighteenth resistor, wherein a positive input terminal of the first differential amplifier is connected to one terminal of the fifteenth resistor and one terminal of the sixteenth resistor, another terminal of the fifteenth resistor is connected to the output terminal of the second proportional operational amplifier sub-circuit, another terminal of the sixteenth resistor is grounded, a negative input terminal of the first differential amplifier is connected to one terminal of the seventeenth resistor and one terminal of the eighteenth resistor, another terminal of the seventeenth resistor is connected between the third resistor and the fourth resistor, and another terminal of the eighteenth resistor is connected to an output terminal of the first differential amplifier;

the second continuously-output conditioning circuit comprises a seventh resistor and an eighth resistor which are series-connected, one end of the series-connected seventh resistor and the eighth resistor is connected to a DC power supply and another end of the series-connected seventh resistor and the eighth resistor is grounded;

the second differential amplifier sub-circuit comprises a second differential amplifier, a nineteenth resistor, a twentieth resistor, a twenty-first resistor, and a twenty-second resistor, wherein a positive input terminal of the second differential amplifier is connected to one terminal of the nineteenth resistor and one terminal of the twentieth resistor, another terminal of the nineteenth resistor is connected to the output terminal of the second proportional operational amplifier sub-circuit, another terminal of the twentieth resistor is grounded, a negative input terminal of the second differential amplifier is connected to one terminal of the twenty-first resistor and one terminal of the twenty-second resistor, another terminal of the twenty-first resistor is connected between the third resistor and the fourth resistor, and another terminal of the twenty-second resistor is connected to an output terminal of the second differential amplifier.

17. The signal measurement device according to claim 12, wherein the first segmented voltage threshold sub-circuit comprises a first resistor and a second resistor which are series-connected, wherein one end of the series-connected first resistor and the second resistor is connected to a DC power supply and another end of the series-connected first resistor and the second resistor is grounded;

the second segmented voltage threshold sub-circuit comprises a third resistor and a fourth resistor which are series-connected, wherein one end of the series-connected third resistor and the fourth resistor is connected to the DC power supply through the selection circuit and another end of the series-connected third resistor and the fourth resistor is grounded.

18. The signal measurement device according to claim 17, wherein the selection circuit comprises a first comparator, a second comparator, a third comparator, a fourth comparator, a first switching tube, and a second switching tube;

wherein a first input terminal of the first comparator is used to receive the input voltage signal, a second input terminal of the first comparator is connected to the first segmented voltage threshold sub-circuit, an output terminal of the first comparator is connected to the first segmented voltage conditioning sub-circuit;

a first input terminal of the second comparator is connected to the first segmented voltage threshold sub-circuit, a second input terminal of the second comparator is used to receive the input voltage signal, and an output terminal of the second comparator is connected to a gate of the first switching tube and a gate of the second switching tube;

a first input terminal of the third comparator is connected to the second segmented voltage threshold sub-circuit, a second input terminal of the second comparator is connected to a source of the first switching tube, and an output terminal of the third comparator is connected to the third segmented voltage conditioning sub-circuit;

a first input terminal of the fourth comparator is connected to a source of the first switching tube, a second input terminal of the fourth comparator is connected to the second segmented voltage threshold sub-circuit, an output terminal of the fourth comparator is connected to the second segmented voltage conditioning sub-circuit;

the source of the first switching tube is further grounded, a drain of the first switching tube is used to receive the input voltage signal;

a source of the second switching tube is grounded and connected to the one end of the series-connected third resistor and the fourth resistor, a drain of the second switching tube is connected to the DC power supply.

19. The signal measurement device according to claim 13, wherein the first segmented voltage conditioning sub-circuit further comprises a first voltage following sub-circuit, wherein a positive input terminal of the first voltage following sub-circuit is connected to the output terminal of the first proportional operational amplifier sub-circuit, and a negative input terminal of the first voltage following sub-circuit is connected to the output terminal of the first voltage following sub-circuit;

the second segmented voltage conditioning sub-circuit further comprises a second voltage following sub-circuit, wherein a positive input terminal of the second voltage following sub-circuit is connected to the output terminal of the second proportional operational amplifier sub-circuit, and a negative input terminal of the second voltage following sub-circuit is connected to the output terminal of the second voltage following sub-circuit;

the third segmented voltage conditioning sub-circuit further comprises a third voltage following sub-circuit, wherein a positive input terminal of the third voltage following sub-circuit is connected to the output terminal of the third proportional operational amplifier sub-circuit, and a negative input terminal of the third voltage following sub-circuit is connected to the output terminal of the third voltage following sub-circuit.

\* \* \* \* \*